(12) United States Patent
Chen

(10) Patent No.: US 11,362,134 B2
(45) Date of Patent: Jun. 14, 2022

(54) VERTICAL STACKS OF LIGHT EMITTING DIODES AND CONTROL TRANSISTORS AND METHOD OF MAKING THEREOF

(71) Applicant: GLO AB, Lund (SE)

(72) Inventor: Zhen Chen, Dublin, CA (US)

(73) Assignee: NANOSYS, INC., Milpitas, CA (US)

(*) Notice: Subject to any disclaimer, the term of this patent is extended or adjusted under 35 U.S.C. 154(b) by 0 days.

(21) Appl. No.: 16/992,605

(22) Filed: Aug. 13, 2020

(65) Prior Publication Data

US 2020/0373349 A1   Nov. 26, 2020

Related U.S. Application Data

(62) Division of application No. 16/565,624, filed on Sep. 10, 2019, now abandoned.

(Continued)

(51) Int. Cl.
    *H01L 27/15* (2006.01)
    *H01L 29/778* (2006.01)
    (Continued)

(52) U.S. Cl.
    CPC ............ *H01L 27/153* (2013.01); *H01L 29/24* (2013.01); *H01L 29/66462* (2013.01);
    (Continued)

(58) Field of Classification Search
    CPC ....... H01L 27/15-156; H01L 29/66462; H01L 29/778-7789; H01L 33/0025;
    (Continued)

(56) References Cited

U.S. PATENT DOCUMENTS 8,053,335 B2    11/2011  Yonehara
8,455,856 B1 *   6/2013  Hersee ................. H01L 25/167
                                                          257/13
(Continued)

FOREIGN PATENT DOCUMENTS

CN      106549031 A  *  3/2017
CN      108962931 A  * 12/2018
(Continued)

OTHER PUBLICATIONS

Notification Concerning Transmittal of International Preliminary Report on Patentability and Written Opinion of the International Search Authority for International Patent Application No. PCT/US2019/050307, dated Apr. 22, 2021, 6 pages.
(Continued)

*Primary Examiner* — Yu Chen
(74) *Attorney, Agent, or Firm* — The Marbury Law Group PLLC

(57) ABSTRACT

A light emitting device includes a vertical stack of a light emitting diode and a field effect transistor that controls the light emitting diode. An isolation layer is present between the light emitting diode and the field effect transistor, and an electrically conductive path electrically shorts a node of the light emitting diode to a node of the field effect transistor. The field effect transistor may include an indium gallium zinc oxide (IGZO) channel and may be located over the isolation layer. Alternatively, the field effect transistor may be a high-electron-mobility transistor (HEMT) including an epitaxial semiconductor channel layer and the light emitting diode may be located over the HEMT.

6 Claims, 17 Drawing Sheets

Related U.S. Application Data

(60) Provisional application No. 62/743,909, filed on Oct. 10, 2018.

(51) Int. Cl.

| | | |
|---|---|---|
| *H01L 33/32* | (2010.01) | |
| *H01L 29/24* | (2006.01) | |
| *H01L 33/62* | (2010.01) | |
| *H01L 33/40* | (2010.01) | |
| *H01L 33/00* | (2010.01) | |
| *H01L 29/66* | (2006.01) | |
| *H01L 33/24* | (2010.01) | |
| *H01L 29/786* | (2006.01) | |
| *H01L 33/44* | (2010.01) | |
| *H01L 21/441* | (2006.01) | |
| *H01L 21/02* | (2006.01) | |
| *H01L 21/467* | (2006.01) | |
| *H01L 29/20* | (2006.01) | |

(52) U.S. Cl.
CPC .... *H01L 29/66969* (2013.01); *H01L 29/7786* (2013.01); *H01L 29/78693* (2013.01); *H01L 33/007* (2013.01); *H01L 33/24* (2013.01); *H01L 33/405* (2013.01); *H01L 33/44* (2013.01); *H01L 33/62* (2013.01); *H01L 21/02565* (2013.01); *H01L 21/441* (2013.01); *H01L 21/467* (2013.01); *H01L 29/2003* (2013.01); *H01L 33/0025* (2013.01); *H01L 33/32* (2013.01); *H01L 2933/0016* (2013.01); *H01L 2933/0025* (2013.01); *H01L 2933/0066* (2013.01)

(58) Field of Classification Search
CPC ............. H01L 33/0062; H01L 33/0066; H01L 33/0075; H01L 33/06; H01L 33/32; H01L 33/12; H01L 33/62; H01L 2933/0066
See application file for complete search history.

(56) References Cited

U.S. PATENT DOCUMENTS

| | | | |
|---|---|---|---|
| 9,041,025 B2 | 5/2015 | Lau et al. | |
| 9,153,732 B2 | 10/2015 | Oraw | |
| 10,032,757 B2 | 7/2018 | Zhang et al. | |
| 10,361,341 B2 | 7/2019 | Danesh et al. | |
| 2005/0167786 A1 | 8/2005 | Gill et al. | |
| 2007/0018190 A1 | 1/2007 | Kim et al. | |
| 2010/0109019 A1 | 5/2010 | Yonehara | |
| 2010/0163893 A1 | 7/2010 | Jeong | |
| 2013/0221368 A1 | 8/2013 | Oraw | |
| 2014/0091993 A1 | 4/2014 | Lau et al. | |
| 2016/0240561 A1 | 8/2016 | Saito et al. | |
| 2016/0293586 A1 | 10/2016 | Ghosh | |
| 2017/0069612 A1 | 3/2017 | Zhang et al. | |
| 2017/0170232 A1* | 6/2017 | Odnoblyudov | H01L 33/0075 |
| 2017/0309676 A1* | 10/2017 | Odnoblyudov | H01L 27/15 |
| 2018/0114878 A1 | 4/2018 | Danesh et al. | |
| 2018/0182275 A1 | 6/2018 | Ahmed et al. | |
| 2019/0074324 A1 | 3/2019 | Kim et al. | |
| 2019/0355766 A1* | 11/2019 | Zhang | H01L 27/124 |
| 2020/0119085 A1 | 4/2020 | Chen | |

FOREIGN PATENT DOCUMENTS

| | | |
|---|---|---|
| JP | 2015-159280 A | 9/2015 |
| WO | WO2017-111797 A1 | 6/2017 |

OTHER PUBLICATIONS

Koo, M. et al., "Biointegrated Flexible Inorganic Light Emitting Diodes," DovePress Review, Nanobiosensors in Disease Diagnosis, vol. 1, pp. 5-15, (2012).

Notification of Transmittal of the International Search Report and Written Opinion of the International Search Authority for International Patent Application No. PCT/US2019/050307, dated Dec. 20, 2019, 9 pages.

* cited by examiner

US 11,362,134 B2

VERTICAL STACKS OF LIGHT EMITTING DIODES AND CONTROL TRANSISTORS AND METHOD OF MAKING THEREOF

FIELD

The embodiments of the invention are directed generally to vertical stacks of light emitting diodes and control transistors and a method of manufacturing the same.

BACKGROUND

Light emitting devices such as light emitting diodes (LEDs) are used in electronic displays, augmented reality displays, virtual reality displays, heads up displays, liquid crystal displays in laptops or LED televisions, and direct displays. Light emitting devices include light emitting diodes (LEDs) and various other types of electronic devices configured to emit light. Generally, the manufacturing process for the various LED-containing displays employ a transfer process in which light emitting diode dies are transferred to a backplane that includes an array of control transistors. The transfer process for the light emitting diode dies can employ bonding of individual light emitting diode dies. The transfer processes for the light emitting diode dies tend to be time consuming and expensive, and are prone to generation of defective devices. A more reliable and inexpensive method of providing control transistors for an array of light emitting diodes is desired.

SUMMARY

According to an aspect of the present disclosure, a light emitting device is provided, which comprises: an epitaxial substrate; a light emitting diode comprising an n-doped semiconductor material layer, a light-emitting active region, and a p-doped semiconductor material layer, in which the light-emitting active region comprises an epitaxial semiconductor material in epitaxial alignment with the epitaxial substrate; at least one dielectric isolation layer overlying the light emitting diode; a field effect transistor located over the dielectric isolation layer and comprising an indium gallium zinc oxide (IGZO) channel; and an electrically conductive path that electrically shorts a node of the light emitting diode to a node of the field effect transistor.

According to another aspect of the present disclosure, a light emitting device is provided, which comprises: an epitaxial substrate; a high-electron-mobility transistor (HEMT) comprising an epitaxial semiconductor channel layer and located on the epitaxial substrate; at least one isolation layer located over the HEMT; a light emitting diode comprising an n-doped semiconductor material layer, a light-emitting active region, and a p-doped semiconductor material layer, wherein the light-emitting active region comprises an epitaxial semiconductor material in epitaxial alignment with the at least one isolation layer; and an electrically conductive path that electrically shorts a node of the light emitting diode to a node of the HEMT.

According to another aspect of the present disclosure, a method of forming a light emitting device is provided, which comprises: forming a light emitting diode comprising an n-doped semiconductor material layer, a light-emitting active region, and a p-doped semiconductor material layer over an epitaxial substrate, wherein the light-emitting active region comprises an epitaxial semiconductor material in epitaxial alignment with the epitaxial substrate; forming at least one dielectric isolation layer over the light emitting diode; forming a field effect transistor comprising an indium gallium zinc oxide (IGZO) channel and over the dielectric isolation layer; and forming an electrically conductive path that electrically shorts a node of the light emitting diode to a node of the field effect transistor.

According to another aspect of the present disclosure, a method of forming a light emitting device is provided, which comprises: forming a high-electron-mobility transistor (HEMT) comprising an epitaxial semiconductor channel layer and on an epitaxial substrate; forming at least one isolation layer over the HEMT, wherein the at least one epitaxial dielectric isolation layer comprises an epitaxial dielectric material in epitaxial alignment with the epitaxial semiconductor channel layer; forming a light emitting diode comprising an n-doped semiconductor material layer, a light-emitting active region, and a p-doped semiconductor material layer over the at least one epitaxial dielectric isolation layer, wherein the light-emitting active region comprises an epitaxial semiconductor material in epitaxial alignment with the at least one epitaxial dielectric isolation layer; and forming an electrically conductive path comprising a contact via structure that extends through the at least one epitaxial dielectric isolation layer, wherein the electrically conductive path electrically shorts a node of the light emitting diode to a node of the HEMT.

DETAILED DESCRIPTION

Figure 1A:
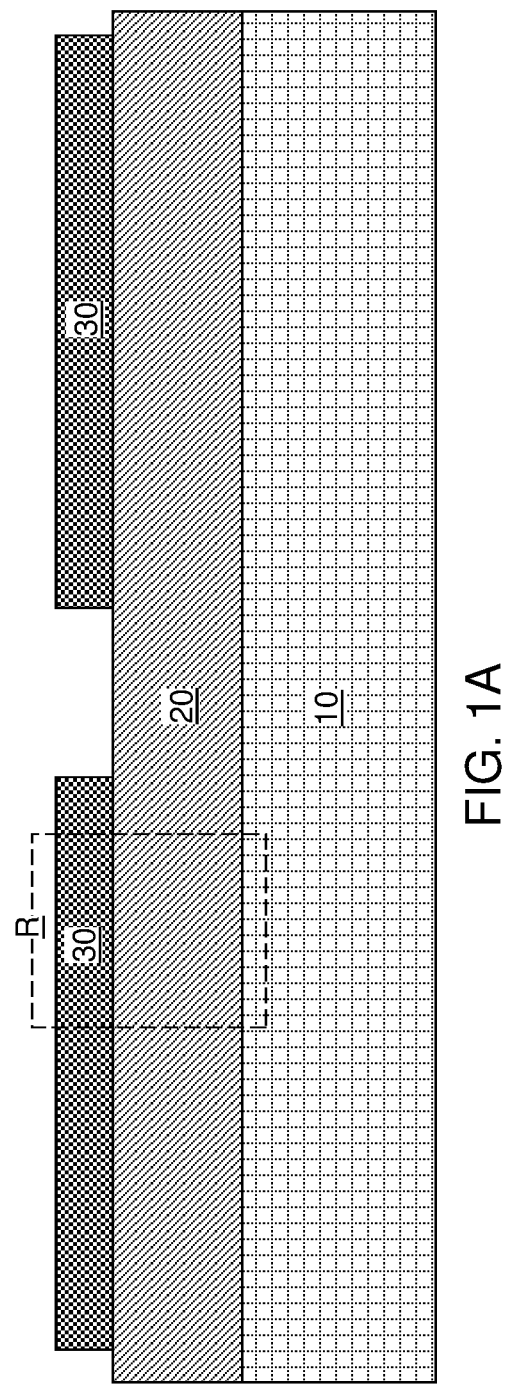
FIG. 1A is a schematic vertical cross-sectional view of a first exemplary structure after formation of light emitting diodes according to a first embodiment of the present disclosure.

As stated above, the present disclosure is directed to vertical stacks of light emitting diodes and control transistors and a method of manufacturing the same, the various aspects of which are described below. Throughout the drawings, like elements are described by the same reference numeral. The drawings are not drawn to scale. Multiple instances of an element may be duplicated where a single instance of the element is illustrated, unless absence of duplication of elements is expressly described or clearly indicated otherwise. Elements with the same reference numerals are presumed to have the same composition and/or components unless expressly stated otherwise. Ordinals such as "first," "second," and "third" are employed merely to identify similar elements, and different ordinals may be employed across the specification and the claims of the instant disclosure. Elements with a same reference numeral are presumed to have a same composition and to have a same thickness range, if applicable, unless expressly disclosed otherwise.

As used herein, a "light emitting device" refers to any device that is configured to emit light and includes any electronic device that is configured to emit light upon application of a suitable electrical bias. A light emitting device may include at least one light emitting diode (LED) that is electrically coupled to at least one control device such as at least one transistor. A light emitting device may include a vertical structure (e.g., a vertical LED) in which the p-side and n-side contacts are located on opposite sides of the structure or a lateral structure in which the p-side and n-side contacts are located on the same side of the structure.

Figure 1B:
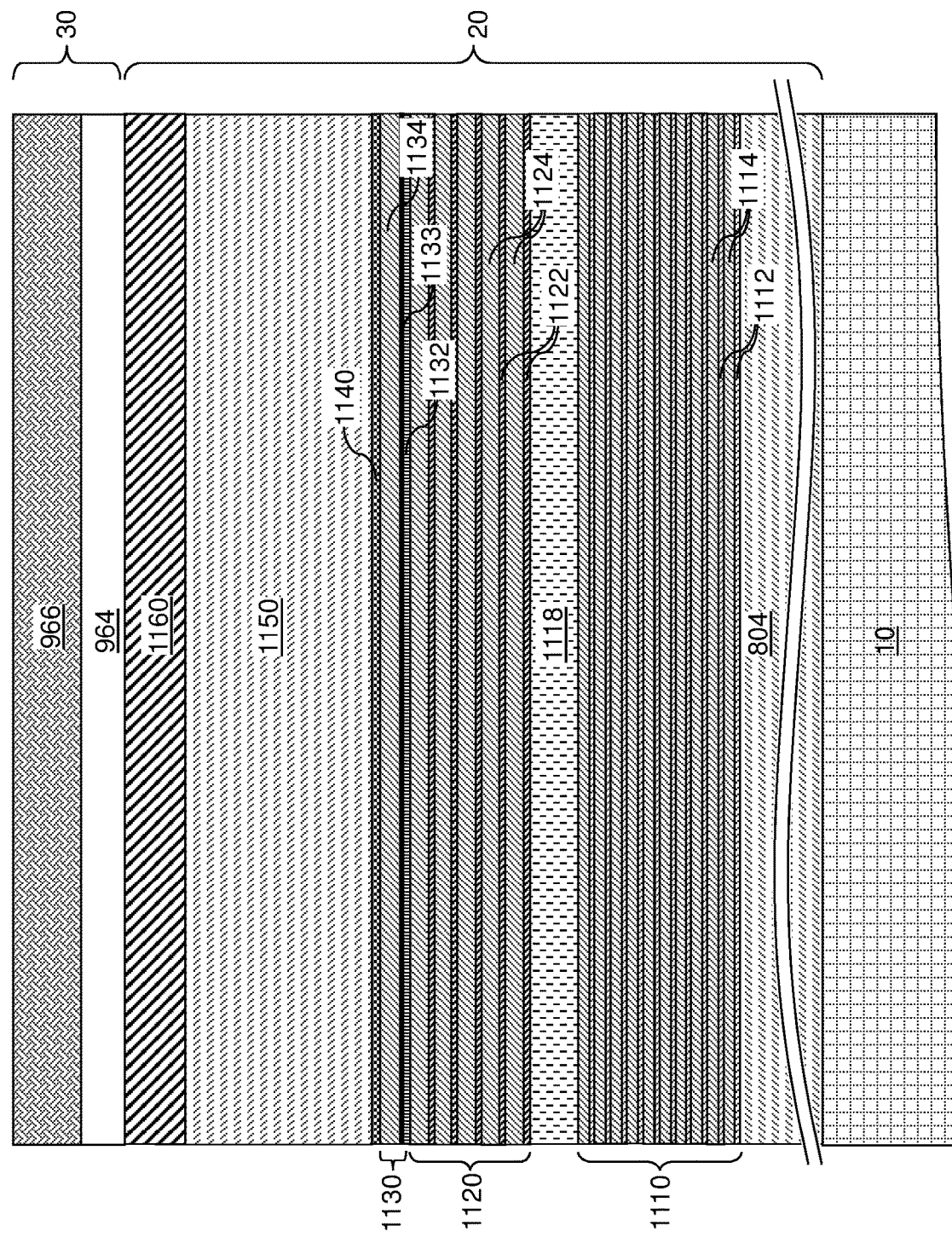
FIG. 1B is a magnified vertical cross-sectional view of a first configuration for a light emitting diode of the first exemplary structure of FIG. 1A.
Figure 1C:
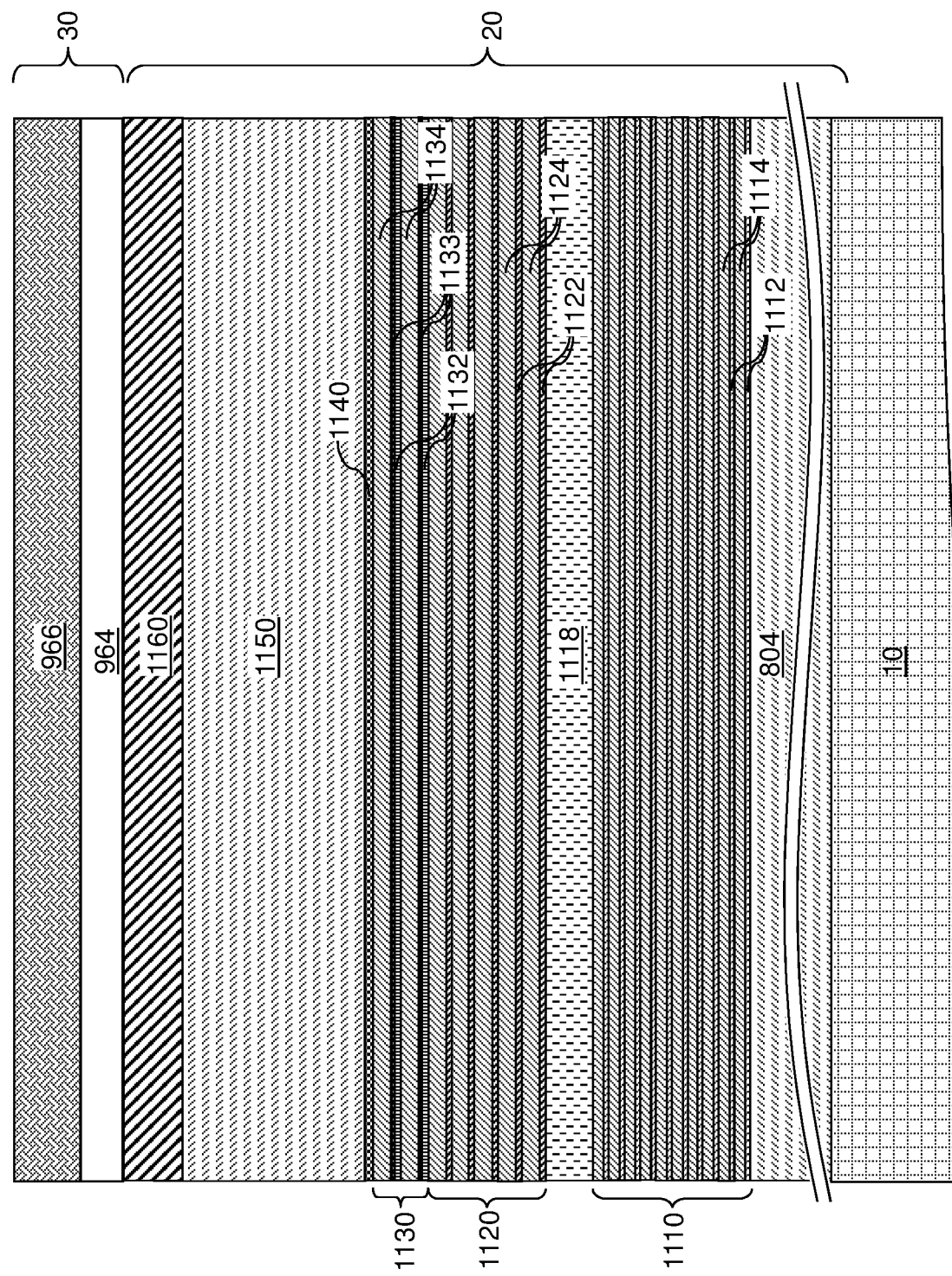
FIG. 1C is a magnified vertical cross-sectional view of a second configuration for a light emitting diode of the first exemplary structure of FIG. 1A.
Figure 1D:
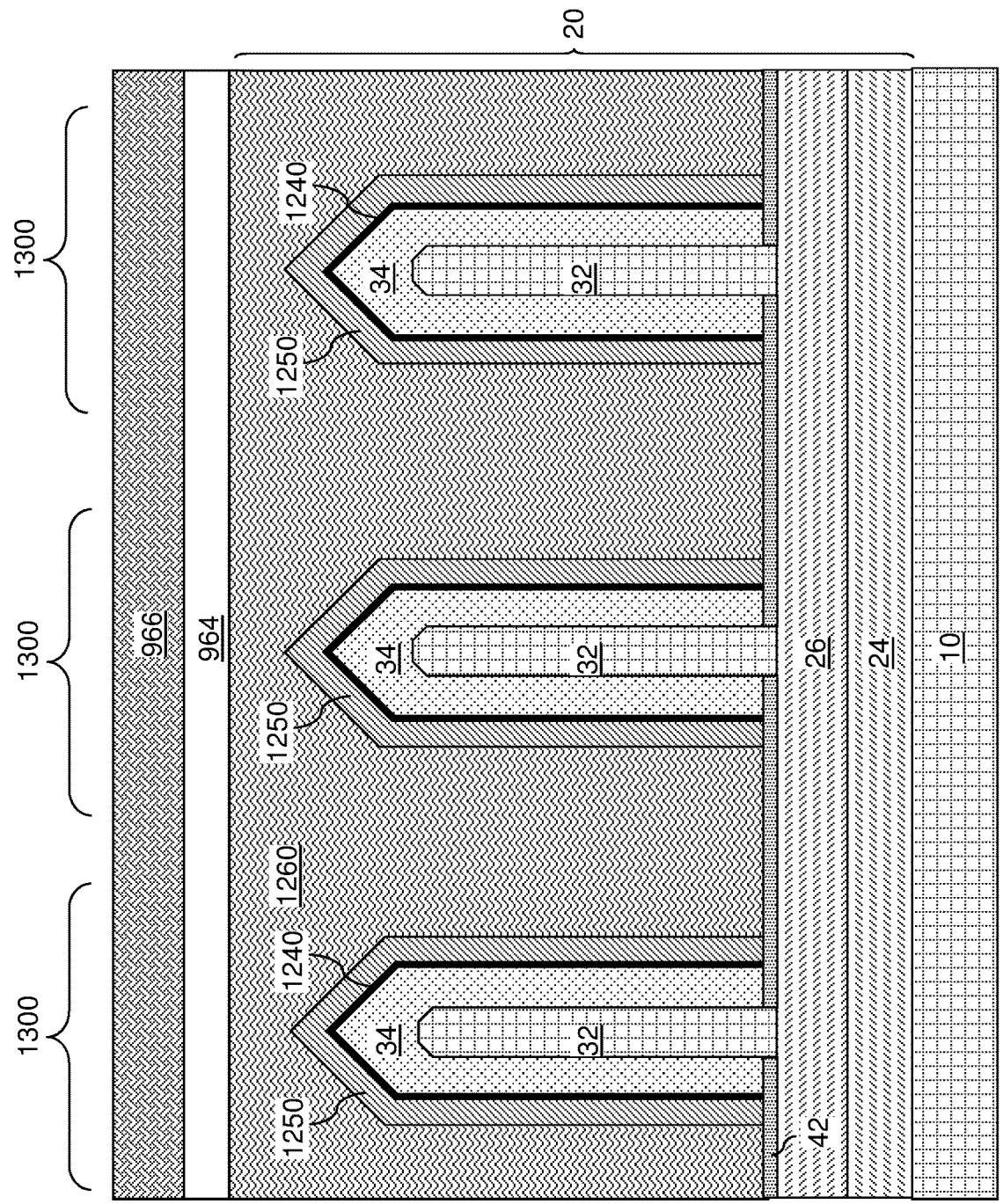
FIG. 1D is a magnified vertical cross-sectional view of a third configuration for a light emitting diode of the first exemplary structure of FIG. 1A.
Figure 1E:
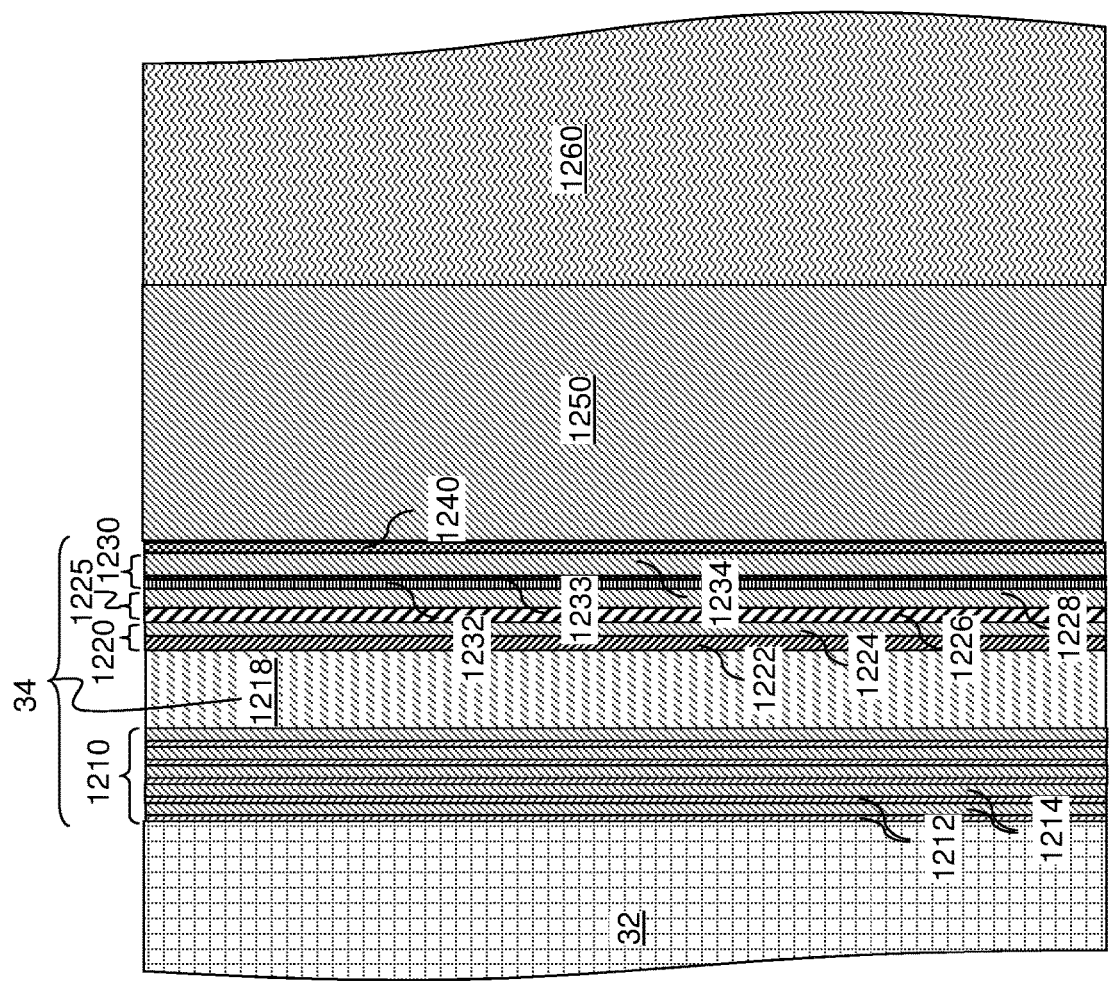
FIG. 1E is another magnified vertical cross-sectional view of a region of a nanowire in the third configuration for a light emitting diode of the first exemplary structure of FIG. 1A.

Referring to FIGS. 1A-1E, various configurations of a first exemplary structure according to a first embodiment of the present disclosure are illustrated after formation of light emitting diodes 20. FIG. 1A is a schematic vertical cross-sectional view of the first exemplary structure. FIG. 1B is a magnified vertical cross-sectional view for a first configuration of the first exemplary structure. FIG. 1C is a magnified vertical cross-sectional view for a second configuration of the first exemplary structure. FIG. 1D is a magnified vertical cross-sectional view of a third configuration of the first exemplary structure. FIG. 1E is another magnified vertical cross-sectional view of the third configuration of the first exemplary structure at a higher magnification than the magnification of FIG. 1D.

The first exemplary structure includes a substrate 10. In one embodiment, the substrate 10 can be a single crystalline substrate on which a III-V compound semiconductor material can be epitaxially deposited. For example, the substrate 10 can be a sapphire (aluminum oxide) layer having a c-plane (0001 plane) as the crystallographic plane of the top surface.

Light emitting diodes 20 are formed on a top surface of the substrate 10. In the first configuration illustrated in FIGS. 1B and 1n the second configuration illustrated in FIG. 1C, the substrate 10 can be an epitaxial substrate 10, and the light emitting diodes 20 can include a single crystalline n-doped gallium nitride layer 804 that includes a single crystalline gallium nitride material in epitaxial alignment with the crystalline structure of the substrate 10. The single crystalline n-doped gallium nitride layer 804 can be formed, for example, by an epitaxial deposition process such as metal-organic chemical vapor deposition (MOCVD) process. The thickness of the single crystalline n-doped gallium nitride layer 804 can be selected such that dislocation defects caused by lattice mismatch between the lattice parameters of the substrate 10 and gallium nitride are healed, and the defect density decreases to a level suitable for device fabrication at the top surface of the single crystalline n-doped gallium nitride layer 804. For example, the thickness of the single crystalline n-doped gallium nitride layer 804 can be in a range from 1.2 microns to 6 microns, although lesser and greater thicknesses can also be employed. The single crystalline n-doped gallium nitride layer 804 may be doped with electrical dopants of a first conductivity type. For example, the single crystalline n-doped gallium nitride layer 804 may be n-doped by introduction of silicon as n-type dopants during the epitaxial deposition process.

In some configurations such as the first and second configurations illustrated in FIGS. 1B and 1C, the light emitting diodes include a planar layer stack (1110, 1118, 1120, 1130, 1140, 1150, 1160) that is formed on the single crystalline n-doped gallium nitride layer 804. The planar layer stack (1110, 1118, 1120, 1130, 1140, 1150, 1160) can include an epitaxial material layer stack (i.e., a stack of epitaxial material layers that are epitaxially aligned among one another) that includes, in order, one or more of planar superlattice structures (1110, 1120) comprising respective strain-modulating layer stacks (1112, 1114) and/or (1112, 1124), a planar light-emitting quantum well that includes a planar light-emitting indium gallium nitride layer 1132 and a planar GaN barrier layer 1134, and a planar p-doped III-nitride layer 1140, which is preferably a p-doped aluminum gallium nitride layer. However, the p-doped III-nitride layer 1140 may alternatively comprise gallium nitride or indium aluminum gallium nitride with a low indium content. The plurality of planar superlattice structures (1110, 1120) can modulate and reduce the strain of the planar light-emitting InGaN layer 1132, thereby enabling high indium incorporation with low defect formation and thus enabling high emission efficiency across the red wavelength range. The planar light-emitting indium gallium nitride layer 1132 may be configured to emit light at a first peak wavelength in a range from 600 nm to 750 nm under electrical bias thereacross. In one embodiment, the first peak wavelength can be in a range from 610 nm to 680 nm.

In an illustrative example, the plurality of strain-modulating layer stacks can include first strain-modulating layer stacks (1112, 1114) and second strain-modulating layer stacks (1122, 1124). Each first strain-modulating layer stack (1112, 1114) can include a first intervening indium gallium nitride layer 1112 and a first intervening GaN layer 1114. Each second strain-modulating layer stack (1122, 1124) can include a second intervening indium gallium nitride layer 1122 and a second intervening GaN layer 1124. In an alternative embodiment, at least one layer among the first intervening GaN layers 1114 and the second intervening GaN layers 1124 may be replaced with a respective intervening aluminum gallium nitride layer or indium gallium nitride layer having a different indium concentration than the first intervening indium gallium nitride layers 1112 or the second intervening indium gallium nitride layers 1122 within the respective strain-modulating layer stack.

In one embodiment, the first intervening indium gallium nitride layers 1112 can have a lower indium concentration than the second intervening indium gallium nitride layers 1122. For example, the first intervening indium gallium nitride layers 1112 can have a composition of $In_pGa_{(1-p)}N$ in which p is in a range from 0.04 to 0.08, although lesser and greater values for p can also be employed. The second intervening indium gallium nitride layers 1122 can have a composition of $In_qGa_{(1-q)}N$ in which q is in a range from 0.08 to 0.12, although lesser and greater values for q can also be employed.

The first strain-modulating layer stacks (1112, 1114) containing the lower indium concentration first intervening indium gallium nitride layers 1112 can be considered as "UV" stacks (e.g., which would emit UV radiation having a peak wavelength less than 400 nm). The second strain-modulating layer stacks (1122, 1124) containing the higher indium concentration second intervening indium gallium nitride layers 1122 can be considered as "blue" stacks (e.g., which would emit blue visible light having a peak wavelength between 400 nm and 495 nm).

The thickness of each first intervening indium gallium nitride layer 1112 can be in a range from 0.7 nm to 1.5 nm, although lesser and greater thicknesses can also be employed. The thickness of each first intervening GaN layer 1114 can be in a range from 3 nm to 6 nm, although lesser and greater thicknesses can also be employed. The thickness of each second intervening indium gallium nitride layer 1122 can be in a range from 2 nm to 3 nm, although lesser and greater thicknesses can also be employed. The thickness of each second intervening GaN layer 1124 can be in a range from 15 nm to 20 nm, although lesser and greater thicknesses can also be employed.

The layers of the first and the second superlattice structures (1110, 1120) may be not intentionally doped with p-type or n-type dopants. Such III-nitride layers that are not intentionally doped typically have n-type conductivity.

Without wishing to be bound by any particular theory, it is believed that it is possible that the effective lattice constant of the second superlattice structure 1120 is greater than the effective lattice constant of the first superlattice structure 1110 due to the indium content of the second intervening indium gallium nitride layers 1122 in the second strain-modulating layer stacks (1122, 1124) of the second superlattice structure 1120 being higher than the indium content of the first intervening indium gallium nitride layers 1112 in the second strain-modulating layer stacks (1122, 1124) of the first superlattice structure 1110.

The first superlattice structure 1110 can include 3 to 30, such as 10 to 15, first strain-modulating layer stacks (1112, 1114), although lesser and greater number of repetitions can also be employed. The total thickness of the first multi quantum well structure 1110 can be in a range from 20 nm to 150 nm, although lesser and greater thicknesses can also be employed.

The second superlattice structure 1120 can include 2 to 15, such as 5 to 10, second strain-modulating layer stacks (1122, 1124), although lesser and greater number of repetitions can also be employed. The total thickness of the second superlattice structure 1120 can be in a range from 20 nm to 150 nm, although lesser and greater thicknesses can also be employed. The second superlattice structure 1120 can include a lower number of strain-modulating layer stacks (i.e., a lower number of layers) than the first superlattice structure 1110.

Each strain-modulating layer stack (1112, 1114) or (1122, 1124) can function as buffer layers that provide strain accommodation between two layers that are located on opposite sides of the strain-modulating layer stack in the respective superlattice structure (1110, 1120). For example, the difference in the lattice parameters of the single crystalline n-doped gallium nitride layer 804 and the planar light-emitting indium gallium nitride layer 1132 can be accommodated by the strain-modulating layer stacks which provide gradual transition of lattice parameters between the single crystalline n-doped gallium nitride layer 804 and the planar light-emitting indium gallium nitride layer 1132 so that the planar light-emitting indium gallium nitride layer 1132 can be formed as a high quality epitaxial film. The superlattice structures (1110, 1120) stop lattice defects, such as dislocations and other defects from propagating from the substrate or underlying layer 804 into the light emitting region 1130 (i.e., active region) containing the planar light-emitting indium gallium nitride layer 1132.

It is noted that the indium gallium nitride and gallium nitride layers in the plurality of strain-modulating layer stacks (1112, 1114) or (1122, 1124) have respective Wurtzite structures. As used herein, an "effective lattice constant" of a layer stack having a Wurtzite structure is the weighted average of hexagonal-plane lattice constants "a" of the Wurtzite structures of all component layers within the layer stack in which each lattice constant "a" is weighted by the fraction defined by the number of all atoms within the respective component layer divided by the number of all atoms within the layer stack.

In one embodiment, the effective lattice parameter and the atomic concentration of indium in the intervening indium gallium nitride layers (1112, 1122) of the plurality of strain-modulating layer stacks (1112, 1114) or (1122, 1124) can monotonically increase with the physical distance of each strain-modulating layer stack (1112, 1114) or (1122, 1124) from the single crystalline n-doped GaN portion, i.e., from the single crystalline n-doped gallium nitride layer 804. Thus, the bottom first intervening indium gallium nitride layer 1112 in the first superlattice 1110 may have a lower indium content and a lower lattice parameter than the top first intervening indium gallium nitride layer 1112 in the first superlattice 1110. Alternatively, all first intervening indium gallium nitride layers 1112 in the first superlattice 1110 may have about the same indium content and the same lattice parameter.

Likewise, in one embodiment, the bottom second intervening indium gallium nitride layer 1122 in the second superlattice 1120 may have a lower indium content and a lower lattice parameter than the top second intervening indium gallium nitride layer 1122 in the second superlattice 1120. Alternatively, all second intervening indium gallium nitride layers 1122 in the second superlattice 1120 may have about the same indium content and the same lattice parameter.

Optionally, a planar GaN spacer layer 1118 can be provided between the groups of the first strain-modulating layer stacks (1112, 1114) of the first superlattice structure 1110 and the groups of the second strain-modulating layer stacks (1122, 1124) of the second superlattice structure 1120 to reduce overall strain during the epitaxial growth of the layers. For example, the planar GaN spacer layer 1118 can have a thickness in the range from 30 nm to 50 nm, although lesser and greater thicknesses can also be employed. The planar GaN spacer layer 1118 may be not intentionally doped with p-type or n-type dopants. Such GaN layer that is not intentionally doped typically has n-type conductivity.

The light emitting region 1130 may comprise a planar light-emitting quantum well 1130. The planar light-emitting quantum well 1130 can be formed on the most distal strain-modulating layer stack, which can be the most distal second strain-modulating layer stack (1122, 1124) within the second superlattice structure 1120. In the first configuration illustrated in FIG. 1B, the planar light-emitting quantum well 1130 includes a planar light-emitting indium gallium nitride layer 1132, a planar aluminum gallium nitride layer 1133, and a planar GaN barrier layer 1134, in that order. In one embodiment, these layers are not intentionally doped.

The planar light-emitting indium gallium nitride layer 1132 includes an epitaxial indium gallium nitride material having a composition that emits light at a peak wavelength in a range from 600 nm to 750 nm, and preferably in a range from 610 nm to 680 nm. In one embodiment, the planar light-emitting indium gallium nitride layer 1132 has a composition of $In_xGa_{(1-x)}N$, in which x is in a range from 0.26 to 0.55 (i.e., higher indium content than underlying indium gallium nitride layers 1112 and 1122). In an embodiment, the planar light-emitting indium gallium nitride layer 1132 can have a thickness in a range from 2 nm to 5 nm.

The planar aluminum gallium nitride layer 1133 can have a composition of $Al_yGa_{(1-y)}N$, in which y is in a range from 0.3 to 1.0 (such as from 0.5 to 0.8). In an embodiment, the planar aluminum gallium nitride layer can have a thickness in a range of 0.5 nm to 5.0 nm, such as from 0.5 nm to 1.0 nm. Without wishing to be bound by any particular theory, it is believed that the planar aluminum gallium nitride layer 1133 reduces or prevents evaporation of indium from the underlying planar light-emitting indium gallium nitride layer 1132 during deposition to provide a sufficiently high indium content in layer 1132 to permit layer 1132 to emit visible light with a peak wavelength in the red color range (e.g., to emit red light). Additionally or alternatively, modification of band structure and piezoelectric effects of the second superlattice structure 1120 may enable shifting the peak wavelength from the aluminum gallium nitride layer 1133 toward a longer wavelength, e.g., toward the red wavelength range from 610 nm to 680 nm. Further, the planar aluminum gallium nitride layer 1133 may provide strain compensation with the p-side layers 1140 and 1150 to provide better quality (i.e., lower defect) p-side layers and/or may moderate the quantum well band structure in the planar aluminum gallium nitride layer 1132 due to an undesirable piezoelectric effect that separates electrons and holes. The strain compensation can occur between the quantum well (that emits the red light) and the rest of the epitaxial stack, principally to reduce misfit defect formation in the active layer itself as well as in the p-layers.

The planar GaN barrier layer 1134 can have a thickness in a range from 15 nm to 20 nm, although lesser and greater thicknesses can also be employed. The planar GaN barrier layer 1134 provides an energy barrier between the planar light-emitting indium gallium nitride layer 1132 and p-type compound semiconductor material layers to be subsequently formed (e.g., to form a quantum well for light emission).

The various material layers within the first superlattice structure 1110, the planar GaN spacer layer 1118, the second superlattice structure 1120, and the planar light-emitting quantum well 1130 can be "undoped" and thus intrinsic (i.e., free of electrical dopants), or have a low concentration level of electrical dopants that is typically caused by incorporation of residual dopants in a reactor chamber. As used herein, an "undoped" semiconductor material refers to a semiconductor material that has not been subjected to an intentional doping process during fabrication. It is well known in the art that an undoped semiconductor material typically has a free charge carrier concentration this is insufficient to render the semiconductor material conductive. Typically, an undoped semiconductor material has a free charge carrier concentration not greater than $1.0 \times 10^{16}/cm^3$.

The second configuration of the first exemplary structure illustrated in FIG. 1C can be derived from the planar material layer stack in the first configuration of the first exemplary structure of FIG. 1B by modifying the light emitting region 1130 to include multiple planar light-emitting quantum wells (i.e., to include two repetitions of a light-emitting indium gallium nitride layer 1132, a planar aluminum gallium nitride layer 1133, and a GaN barrier layer 1134). Thus, the light emitting region 1130 of the second exemplary planar material layer stack includes a stack, from a proximal side to the planar single crystalline n-doped GaN layer 804 to a distal side from the planar single crystalline n-doped GaN layer 804, a light-emitting indium gallium nitride layer 1132, a planar aluminum gallium nitride layer 1133, a GaN barrier layer 1134, an additional light-emitting indium gallium nitride layer 1132 located on the GaN barrier layer 1134, an addition planar aluminum gallium nitride layer 1133, and an additional GaN barrier layer 1134 located on the additional light-emitting indium gallium nitride layer 1133. The p-doped aluminum gallium nitride layer 1140 can be formed directly on the additional GaN barrier layer 1134.

A planar p-doped III-nitride layer, such as p-doped aluminum gallium nitride layer 1140 can be formed on the planar light-emitting quantum well 1130 of the first or second configuration of the first exemplary structure. For example, the planar p-doped aluminum gallium nitride layer 1140 can be formed directly on the planar GaN barrier layer 1134. In an embodiment, the planar p-doped aluminum gallium nitride layer 1140 can have a thickness in a range from 10 nm to 20 nm, although lesser and greater thicknesses can also be employed. In an embodiment, the planar p-doped aluminum gallium nitride layer 1140 can be p-doped at a dopant concentration that provides a free charge carrier concentration (i.e., the concentration of holes) in a range from $1.0 \times 10^{17}/cm^3$ to $3.0 \times 10^{20}/cm^3$, such as from $3.0 \times 10^{17}/cm^3$ to $1.0 \times 10^{20}/cm^3$, although lesser and greater free charge carrier concentrations can also be employed. The planar p-doped aluminum gallium nitride layer 1140 can have a lower aluminum contact than the aluminum gallium nitride layer 1133. For example, the planar p-doped aluminum gallium nitride layer 1140 can have a composition $Al_zGa_{(1-z)}N$, in which z is less than 0.5, such as in a range from 0.2 to 0.3.

An optional first p-doped compound semiconductor material layer 1150 can be formed on the planar p-doped aluminum gallium nitride layer 1140. The first p-doped compound semiconductor material layer 1150 can include a p-doped single crystalline compound semiconductor material such as p-doped gallium nitride. In one embodiment, the first p-doped compound semiconductor material layer 1150 can be p-doped at a dopant concentration that provides a free charge carrier concentration (i.e., the concentration of holes) in a range from $1.0\times10^{17}/cm^3$ to $3.0\times10^{20}/cm^3$, such as from $3.0\times10^{17}/cm^3$ to $1.0\times10^{20}/cm^3$, although lesser and greater free charge carrier concentrations can also be employed.

A second p-doped compound semiconductor material layer 1160 can be formed on the first p-doped compound semiconductor material layer 1150. The second p-doped compound semiconductor material layer 1160 can include a heavily p-doped single crystalline compound semiconductor material such as p-doped gallium nitride. The dopant concentration in the second p-doped compound semiconductor material layer 1160 can be greater than the dopant concentration in the first p-doped compound semiconductor material layer 1150. In one embodiment, the second p-doped compound semiconductor material layer 1160 can be heavily p-doped at a dopant concentration that provides a free charge carrier concentration (i.e., the concentration of holes) in a range from $5.0\times10^{19}/cm^3$ to $3.0\times10^{21}/cm^3$, such as from $1.0\times10^{20}/cm^3$ to $2.0\times10^{21}/cm^3$, although lesser and greater free charge carrier concentrations can also be employed. The total thickness of the first and second p-doped compound semiconductor material layers (1150, 1160) can be in a range from 90 nm to 200 nm, although lesser and greater thicknesses can also be employed.

Top electrodes 30 can be formed on the light emitting diodes 20. The area of each light emitting diode 20 can be defined by the area of a respective one of the top electrodes 20. In one embodiment, each top electrode 30 can include a vertical stack of a transparent conductive electrode and a patterned portion of a reflector layer 966.

The transparent conductive electrodes can be formed by depositing and patterning a transparent conductive oxide layer 964 over the first and second p-doped compound semiconductor material layers (1150, 1160). In case light emitted from the light-emitting indium gallium nitride layer 1132 is directed downward toward the single crystalline n-doped gallium nitride layer 804 by a reflector layer to be subsequently formed above the transparent conductive electrode, then the transparent conductive oxide layer 964 is herein referred to a backside transparent conductive oxide layer 964. The transparent conductive oxide layer 964 includes a transparent conductive oxide material such as indium tin oxide or aluminum doped zinc oxide. The transparent conductive oxide layer 964 can be deposited as a continuous material layer that extends across the entire area of the p-doped compound semiconductor material layer 812. The thickness of the transparent conductive oxide layer 964 can be in a range from 100 nm to 2 microns, such as from 200 nm to 1 micron, although lesser and greater thicknesses can also be employed.

Optionally, a reflector material can be deposited to form a reflector layer 966 that continuously extends over the backside transparent conductive oxide layer 964. The reflector layer 966 is electrically shorted to the p-doped compound semiconductor material layer 1160 through the backside transparent conductive oxide layer 964. In one embodiment, the reflector layer 966 includes at least one material selected from silver, aluminum, copper, and gold. In one embodiment, the reflector material can be deposited by physical vapor deposition (sputtering) or vacuum evaporation. The reflector layer 966 can be employed to reflect light emitted from the active region 1130 through the transparent substrate 10. In case the reflector layer 966 is deposited and patterned to be incorporated into top electrodes (964, 966), the area of each patterned portion of the reflector layer 966 defines the areas of a respective light emitting diode. Each light emitting diode 20 can be in a downward-emitting configuration, i.e., a configuration in which light exits the light emitting diodes through the substrate 10, which can include a transparent material such as sapphire.

While exemplary configurations of planar light emitting diodes are presented in the drawings for illustrative purposes, the present invention can be practiced with any other planar light emitting diodes that are formed on a substrate 10.

Other types of light emitting diodes 20 can be formed on the substrate 10 in lieu of, or in addition to, the light emitting diodes 20 in the first or second configuration. FIGS. 1D and 1E illustrate a third configuration of the first exemplary structure that includes non-planar diodes, i.e., diodes including non-planar structures therein.

In the third configuration of the exemplary structure, the light emitting diodes 20 can include an optional epitaxial buffer semiconductor layer 24 and a planar single crystalline n-doped GaN layer 26 that are formed on the substrate 10. The planar single crystalline n-doped GaN layer 26 functions as one node of each light emitting diode to be subsequently formed. The substrate 10 can be an epitaxial substrate, and the optional epitaxial buffer semiconductor layer 24 and the planar single crystalline n-doped GaN layer 26 can be formed by an epitaxial deposition process so that each of the epitaxial buffer semiconductor layer 24 and the planar single crystalline n-doped GaN layer 26 includes a single crystalline semiconductor material that is epitaxially aligned to the single crystalline structure of the growth substrate 802 (which can include a single crystalline sapphire ($Al_2O_3$) substrate).

A growth mask 42 is subsequently formed on the top surface of the planar single crystalline n-doped GaN layer 26. The growth mask 42 includes a dielectric material such as silicon nitride or silicon oxide, and can be formed, for example, by chemical vapor deposition. The thickness of the growth mask 42 can be in a range from 10 nm to 500 nm, although lesser and greater thicknesses can also be employed.

Openings are formed through the growth mask 42, for example, by application and patterning of a photoresist layer (not shown) and a subsequent etch process that etches physically exposed portions of the growth mask 42 employing the patterned photoresist layer as an etch mask. The photoresist layer can be subsequently removed, for example, by ashing. The openings may be circular, elliptical, or polygonal. In an illustrative example, the maximum lateral dimension of each opening (such as a diameter or a major axis) may be in a range from 50 nm to 500 nm, although lesser and greater maximum lateral dimensions can be employed for each. The openings can form a two-dimensional array, which may be, for example, a hexagonal array (which includes an equilateral triangular array), a rectangular array, or a parallelogram array. The center-to-center distance between a neighboring pair of openings can be in a range from 150 nm to 5 microns, although lesser and greater spacings can also be employed.

Nanowire cores 32 can be grown through the openings in the patterned growth mask 42 by a selective epitaxy process performed in a Group V limited regime. Alternatively, a silicon enriched growth CVD method, a pulsed growth CVD method or an MBE method can be employed to form the nanowire cores 32. Each nanowire core 32 extends through a respective opening in the patterned growth mask 42 along a direction substantially perpendicular to the top surface of the substrate 802. The nanowire cores 32 can be grown from the physically exposed surfaces of the planar single crystalline n-doped GaN layer 26 by a selective epitaxy process under process conditions that provide epitaxial growth of a single crystalline doped semiconductor material having a doping of the first conductivity type (such as n-doped GaN) along the direction perpendicular to the c-plane. The c-plane can be parallel to the top surface of the planar single crystalline n-doped GaN layer 26. Growth of the nanowire cores 32 can be performed by a selective semiconductor deposition process that grows a single crystalline semiconductor material from physically exposed semiconductor surfaces primarily along the c-direction, i.e., the direction perpendicular to the c-plane, while not growing any semiconductor material from dielectric surfaces. The entirety of each nanowire core 32 can be single crystalline and in epitaxial alignment with the planar single crystalline n-doped GaN layer 26.

As used herein, the aspect ratio of each nanowire core 32 is defined as the final height of the nanowire core to the maximum lateral dimension at the base of the nanowire core, which is the maximum lateral dimension of the respective opening through the growth mask 42. The aspect ratio of the nanowire cores 32 can be in a range from 2 to 40, although lesser and greater aspect ratios can also be employed.

A shell layer stack 34 is formed on each nanowire cores 32, which is a single crystalline n-doped GaN portion. FIG. 1E is a magnified view of a region of the exemplary device structure of FIG. 1D. The growth mode can change to a Group III limited growth mode, which is also referred to as a high V/III growth mode employed in conventional growth of III-V materials, for formation of the shell layers within the shell layer stack 34. Thus, the shell layers can be formed on all physically exposed semiconductor surfaces during the respective selective epitaxy processes.

The shell layer stack 34 can include an epitaxial shell layer stack (i.e., a stack of epitaxial shell layers that are epitaxially aligned among one another) that includes, in order, an optional plurality of shell strain-modulating layer stacks (1210, 1220, 1225), a shell light-emitting quantum well that includes a shell light-emitting indium gallium nitride layer 1232, a shell aluminum gallium nitride layer 1133, a shell GaN barrier layer 1234, and a shell p-doped aluminum gallium nitride layer 1240. The shell light-emitting indium gallium nitride layer 1232 is configured to emit light at a first peak wavelength in a range from 600 nm to 750 nm under electrical bias thereacross. In one embodiment, the first peak wavelength can be in a range from 610 nm to 680 nm. As used herein, a "shell layer" refers to a continuous material layer that laterally encloses and overlies all facets of a nanowire core 32. The thickness of a shell layer may vary across facets of the nanowire core 32. For example, vertical portions of a shell layer may be thicker than angled portions of the shell layer.

Each strain-modulating layer stack (1210, 1220, 1225) includes at least a pair of layers that includes a respective intervening indium gallium nitride layer (1212, 1222, 1226) and a respective intervening GaN layer (1214, 1224, 1228). The inner most strain-modulating layer stack may comprise a superlattice shell 1210 which contains a plurality of stacks of pairs of layers 1212 and 1214. Each strain-modulating layer stack (1210, 1220, 1225) can function as buffer layers that provide strain relaxation between two layers that are located on opposite sides of the strain-modulating layer stack (1210, 1220, 1225). For example, the difference in the lattice parameters of the single crystalline n-doped gallium nitride portion of the nanowire cores 32 and the shell light-emitting indium gallium nitride layer 1232 can be accommodated by the strain-modulating layer stack (1210, 1220, 1225), which provide gradual transition of lattice parameters and trap lattice defects between the nanowire core 32 and the shell light-emitting indium gallium nitride layer 1232 so that the shell light-emitting indium gallium nitride layer 1232 can be formed as a high quality epitaxial film.

The various layers in the plurality of shell strain-modulating layer stacks (1210, 1220, 1225) have respective Wurtzite structures. In an illustrative example, the plurality of strain-modulating layer stacks (1210, 1220, 1225) can include a superlattice shell 1210 of a plurality (e.g., five to ten) of first strain-modulating layer stacks (1212, 1214), a second strain-modulating layer stack 1220, and a third strain-modulating layer stack 1225. Each first strain-modulating layer stack (1212, 1214) can include a first intervening indium gallium nitride layer 1212 and a first intervening GaN layer 1214. The second strain-modulating layer stack 1220 can include a second intervening indium gallium nitride layer 1222 and a second intervening GaN layer 1224. The third strain-modulating layer stack 1225 can include a third intervening indium gallium nitride layer 1226 and a third intervening GaN layer 1228.

Each of the first strain-modulating layer stacks (1212, 1214) can have a first effective lattice constant, the second strain-modulating layer stack 1220 can have a second effective hexagonal-plane lattice constant that is greater than the first effective hexagonal-plane lattice constant, and the third strain-modulating layer stack 1225 can have a third effective hexagonal-plane lattice constant that is greater than the second effective hexagonal-plane lattice constant.

In one embodiment, the atomic concentration of indium in the intervening indium gallium nitride layers (1212, 1222, 1226) of the plurality of strain-modulating layer stacks (1210, 1220, 1225) can monotonically increase with the physical distance of each strain-modulating layer stack (1210, 1220, 1225) from the single crystalline n-doped GaN portion, i.e., from the nanowire core 32.

In one embodiment, the first intervening indium gallium nitride layers 1212 can have a lower indium concentration than the second intervening indium gallium nitride layer 1222. For example, the first intervening indium gallium nitride layers 1212 can have a composition of $In_pGa_{(1-p)}N$ in which p is in a range from 0.04 to 0.08, although lesser and greater values for p can also be employed. The second intervening indium gallium nitride layer 1222 can have a composition of $In_qGa_{(1-q)}N$ in which p is in a range from 0.10 to 0.12, although lesser and greater values for q can also be employed. The third intervening indium gallium nitride layer 1226 can have a composition of $In_rGa_{(1-r)}N$ in which r is in a range from 0.15 to 0.30, although lesser and greater values for r can also be employed. The thickness of each first intervening indium gallium nitride layer 1212 can be in a range from 0.7 nm to 1.5 nm, although lesser and greater thicknesses can also be employed. The thickness of each first intervening GaN layer 1214 can be in a range from 3 nm to 5 nm, although lesser and greater thicknesses can also be employed. The thickness of the second intervening indium gallium nitride layer 1222 can be in a range from 4 nm to 6 nm, although lesser and greater thicknesses can also be employed. The thickness of the second intervening GaN layer 1224 can be in a range from 2 nm to 4 nm, although lesser and greater thicknesses can also be employed. The thickness of the third intervening indium gallium nitride layer 1226 can be in a range from 2.5 nm to 8 nm, although lesser and greater thicknesses can also be employed. The thickness of the third intervening GaN layer 1224 can be in a range from 6 nm to 10 nm, although lesser and greater thicknesses can also be employed.

Optionally, a shell GaN spacer layer 1218 can be provided between the groups of the first strain-modulating layer stacks (1212, 1214) (i.e., the superlattice shell 1210) and the second strain-modulating layer stack 1220 to reduce overall stress during the epitaxial growth of the shell layers. For example, the shell GaN spacer layer 1218 can have a thickness in the range from 30 nm to 50 nm, although lesser and greater thicknesses can also be employed.

In one embodiment, the effective hexagonal-plane lattice constant of the second strain-modulating layer stack 1220 can be greater than the effective hexagonal-plane lattice constant of the first superlattice shell 1210, and the effective hexagonal-plane lattice constant of the third strain-modulating layer stack 1225 can be greater than the effective hexagonal-plane lattice constant of the second strain-modulating layer stack 1220. Further, the atomic concentration of indium in the second intervening indium gallium nitride layer 1222 can be greater than the atomic concentration of indium in the first intervening indium gallium nitride layers 1212, and the atomic concentration of indium in the third intervening indium gallium nitride layer 1226 can be greater than the atomic concentration of indium in the second intervening indium gallium nitride layer 1222. The atomic percentage of indium in the second strain-modulating layer stack 1220 can be greater than the atomic percentage of indium in the superlattice shell 1210, and the atomic percentage of indium in the third strain-modulating layer stack 1225 can be greater than the atomic percentage of indium in the second strain-modulating layer stack 1220.

The superlattice shell 1210 can emit UV radiation, the second strain-modulating layer stack 1220 can emit blue visible light and the third strain-modulating layer stack 1225 can emit green visible light. In one embodiment, the second strain-modulating layer stack 1220 can have a non-uniform surface profile having at least 3 peaks, where each of the at least 3 peaks is separated from an adjacent one of the at least 3 peaks by a valley; and each of the at least 3 peaks extends at least 2 nm in a radial direction away from an adjacent valley, as described in U.S. Pat. No. 9,281,442, which is incorporated by reference herein in its entirety. This second strain-modulating layer stack 1220 with the non-uniform surface profile can be used for surface profile modification/preparation of the light emitting region shell 1230 with indium rich regions in addition to strain management.

The light emitting region shell 1230 can be a light-emitting quantum well which is formed on the most distal strain-modulating layer stack, which can be the third strain-modulating layer stack 1225. The shell light-emitting quantum well 1230 includes a shell light-emitting indium gallium nitride layer 1232, a shell aluminum gallium nitride layer 1233, and a shell GaN barrier layer 1234.

The shell light-emitting indium gallium nitride layer 1232 includes an epitaxial indium gallium nitride material having a composition that emits light at a peak wavelength in a range from 600 nm to 750 nm, and preferably in a range from 610 nm to 680 nm. In one embodiment, the shell light-emitting indium gallium nitride layer 1232 can have a thickness in a range from 3 nm to 7 nm.

In one embodiment, the shell light-emitting indium gallium nitride layer 1232 contains indium rich regions having at least 5 atomic percent higher indium content than indium poor regions in the active region quantum well shell, which is believed to be at least in part due to the non-uniform surface profile of the underlying second strain-modulating layer stack 1220, as described in U.S. Pat. No. 9,281,442.

The shell aluminum gallium nitride layer 1233 includes a thin aluminum gallium nitride material that can prevent evaporation of indium from the underlying shell light-emitting indium gallium nitride layer 1232 during fabrication. The shell aluminum gallium nitride layer 1233 can have a composition of $Al_yGa_{(1-y)}N$, in which y is in a range from 0.3 to 1.0 (such as from 0.5 to 0.8). In one embodiment, the shell aluminum gallium nitride layer can have a thickness in a range from 0.2 nm to 3.0 nm (such as 0.5 nm to 1.5 nm), such as from 0.5 nm to 1.0 nm.

The shell GaN barrier layer 1234 can have a thickness in a range from 5 nm to 20 nm. The shell GaN barrier layer 1234 provides an energy barrier between the shell light-emitting indium gallium nitride layer 1232 and p-type compound semiconductor material layers to be subsequently formed. Optionally, one or more of the various strain-modifying layers (1210, 1218, 1220, 1225) described above may be omitted and the shell light-emitting quantum well 1230 may be formed directly on the nanowire core 32, on a GaN or AlGaN barrier layer, and/or on one of the other shell layers located on the nanowire core 32, due to the nano-compliancy of the nanowire core 32.

The various material layers within the superlattice shell 1210, the shell GaN spacer layer 1218, the second strain-modulating layer stack 1220, the third strain-modulating layer stack 1225, and the shell light-emitting quantum well 1230 can be undoped (e.g., not intentionally doped), and may have a free charge carrier concentration not greater than $1.0 \times 10^{19}/cm^3$.

A shell p-doped aluminum gallium nitride layer 1240 can be formed on the shell layer stack 34, i.e., on the shell light-emitting quantum well 1230. For example, the shell p-doped aluminum gallium nitride layer 1240 can be formed directly on the shell GaN barrier layer 1234. In one embodiment, the shell p-doped aluminum gallium nitride layer 1240 can have a thickness in a range from 10 nm to 30 nm, although lesser and greater thicknesses can also be employed. In one embodiment, the shell p-doped aluminum gallium nitride layer 1240 can be p-doped at a dopant concentration that provides a free charge carrier concentration (i.e., the concentration of holes) in a range from $1.0 \times 10^{17}/cm^3$ to $3.0 \times 10^{20}/cm^3$, such as from $3.0 \times 10^{17}/cm^3$ to $1.0 \times 10^{20}/cm^3$, although lesser and greater free charge carrier concentrations can also be employed. The shell p-doped aluminum gallium nitride layer 1240 can have a lower aluminum content than the shell aluminum gallium nitride layer 1233 and can have a composition of $Al_zGa_{(1-z)}N$, in which z is less than 0.5, such as in a range from 0.2 to 0.3.

A first p-doped compound semiconductor material layer 1250 can be formed on the shell stack 34 (e.g., on the shell p-doped aluminum gallium nitride layer 1240 which forms the outer surface of the shell stack 34). The first p-doped compound semiconductor material layer 1250 can include a p-doped single crystalline compound semiconductor material such as p-doped gallium nitride. In one embodiment, the first p-doped compound semiconductor material layer 1250 can be p-doped at a dopant concentration that provides a free charge carrier concentration (i.e., the concentration of holes) in a range from $1.0 \times 10^{17}/cm^3$ to $3.0 \times 10^{20}/cm^3$, such as from $3.0 \times 10^{17}/cm^3$ to $1.0 \times 10^{20}/cm^3$, although lesser and greater free charge carrier concentrations can also be employed. The deposited p-doped compound semiconductor material coalesces between the nanowires, with or without vertical seams or voids laterally surrounding each nanowire, to form the first p-doped compound semiconductor material layer 1250 as a continuous material layer.

Each combination of a nanowires core 32, a shell layer stack 34, a shell p-doped aluminum gallium nitride layer 1240, and a first p-doped compound semiconductor material layer 1250 constitutes a semiconductor nanowire 1300.

A second p-doped compound semiconductor material layer 1260 can be formed on the first p-doped compound semiconductor material layer 1250. The second p-doped compound semiconductor material layer 1260 can include a p-doped single crystalline compound semiconductor material such as p-doped gallium nitride. The dopant concentration in the second p-doped compound semiconductor material layer 1260 can be greater than the dopant concentration in the first p-doped compound semiconductor material layer 1250. In one embodiment, the second p-doped compound semiconductor material layer 1260 can be p-doped at a dopant concentration that provides a free charge carrier concentration (i.e., the concentration of holes) in a range from $5.0 \times 10^{19}/cm^3$ to $3.0 \times 10^{21}/cm^3$, such as from $1.0 \times 10^{20}/cm^3$ to $2.0 \times 10^{21}/cm^3$, although lesser and greater free charge carrier concentrations can also be employed. The thickness of the second p-doped compound semiconductor material layer 1260 is selected such that the second p-doped compound semiconductor material layer 1260 is either formed as a continuous material layer filling the gaps between the semiconductor nanowires 1300 and providing a continuous top surface or forms an air-bridge structure enclosing air gaps between the semiconductor nanowires, as described in U.S. Pat. No. 8,350,249, incorporated herein by reference in its entirety.

Top electrodes 30 can be formed on the light emitting diodes 20. The area of each light emitting diode 20 can be defined by the area of a respective one of the top electrodes 20. In one embodiment, each top electrode 30 can include a vertical stack of a transparent conductive electrode and a patterned portion of a reflector layer 966.

The transparent conductive electrodes can be formed by depositing and patterning a transparent conductive oxide layer 964 over the first and second p-doped compound semiconductor material layers (1150, 1160). In case light emitted from the light emitting diodes 20 is directed downward toward the substrate 10 by a reflector layer to be subsequently formed above the transparent conductive electrode, then the transparent conductive oxide layer 964 is herein referred to a backside transparent conductive oxide layer 964. The transparent conductive oxide layer 964 includes a transparent conductive oxide material such as indium tin oxide or aluminum doped zinc oxide. The transparent conductive oxide layer 964 can be deposited as a continuous material layer that extends across the entire area of the p-doped compound semiconductor material layer 812. The thickness of the transparent conductive oxide layer 964 can be in a range from 100 nm to 2 microns, such as from 200 nm to 1 micron, although lesser and greater thicknesses can also be employed.

Optionally, a reflector material can be deposited to form a reflector layer 966 that continuously extends over the backside transparent conductive oxide layer 964. The reflector layer 966 is electrically shorted to the p-doped compound semiconductor material layer 1160 through the backside transparent conductive oxide layer 964. In one embodiment, the reflector layer 966 includes at least one material selected from silver, aluminum, copper, and gold. In one embodiment, the reflector material can be deposited by physical vapor deposition (sputtering) or vacuum evaporation. The reflector layer 966 can be employed to reflect light emitted from the active region 1130 through the transparent substrate 10. In case the reflector layer 966 is deposited and patterned to be incorporated into top electrodes (964, 966), the area of each patterned portion of the reflector layer 966 defines the areas of a respective light emitting diode. Each light emitting diode 20 can be in a downward-emitting configuration, i.e., a configuration in which light exits the light emitting diodes through the substrate 10, which can include a transparent material.

While exemplary configurations of non-planar light emitting diodes are illustrated for illustrative purposes, the present invention can be practiced with any other non-planar light emitting diodes that are formed on a substrate 10.

The substrate 10 can be an epitaxial substrate, and at least one light emitting diode 20 can be formed on the substrate. Each light emitting diode 20 can include an n-doped semiconductor material layer, a light-emitting active region, and a p-doped semiconductor material layer. In one embodiment, each light-emitting active region can comprise an epitaxial semiconductor material in epitaxial alignment with the epitaxial substrate.

Figure 2:
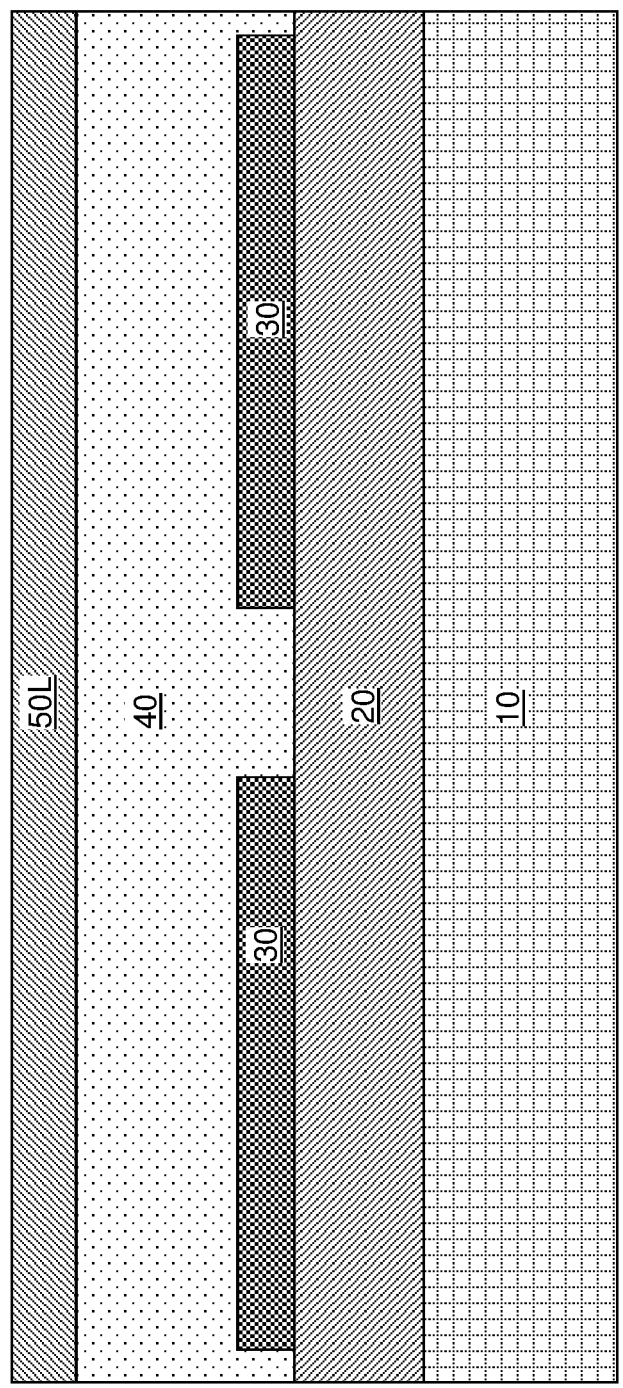
FIG. 2 is a schematic vertical cross-sectional view of the first exemplary structure after formation of at least one dielectric isolation layer and an indium gallium zinc oxide (IGZO) layer according to the first embodiment of the present disclosure.

Referring to FIG. 2, at least one dielectric isolation layer 40 can be formed on the light emitting diodes 20 and the top electrodes 30. The at least one dielectric isolation layer 40 can include a single dielectric material layer, or can include a plurality of dielectric material layers. The at least one dielectric isolation layer 40 can include at least one amorphous dielectric material layer. The at least one dielectric isolation layer 40 can include silicon oxide, silicon nitride, and/or at least one dielectric oxide material (such as aluminum oxide). Optionally, the topmost surface of the at least one dielectric isolation layer 40 can be planarized, for example, by chemical mechanical planarization. The thickness of the at least one dielectric isolation layer 40 above the top electrodes 30 can be in a range from 0.2 microns to 10 microns, such as from 0.4 microns to 5 microns, although lesser and greater thicknesses can also be employed.

An indium gallium zinc oxide (IGZO) layer 50L can be formed on the top surface of the at least one dielectric isolation layer 50L. IGZO has a high electron mobility that is about 20-50 L times the electron mobility of amorphous silicon, and can be employed as the channel material for field effect transistors having high switching speeds. IGZO has a uniform amorphous phase, and can be deposited by pulsed laser deposition (PLD). In a PLD process, a laser can be employed to focus on nano-sized spots on solid elemental targets. Laser pulse frequencies are varied between the targets in ratios to control the composition of the film. The deposition chamber can be in a vacuum environment with a residual oxygen pressure, which can be employed to improve electrical properties of the deposited IGZO material. Alternatively, spin-coating may be employed in lieu of a PLD process to deposit the IGZO material. The thickness of the IGZO layer 50L may be in a range from 30 nm to 300 nm, although lesser and greater thicknesses can also be employed.

Figure 3:
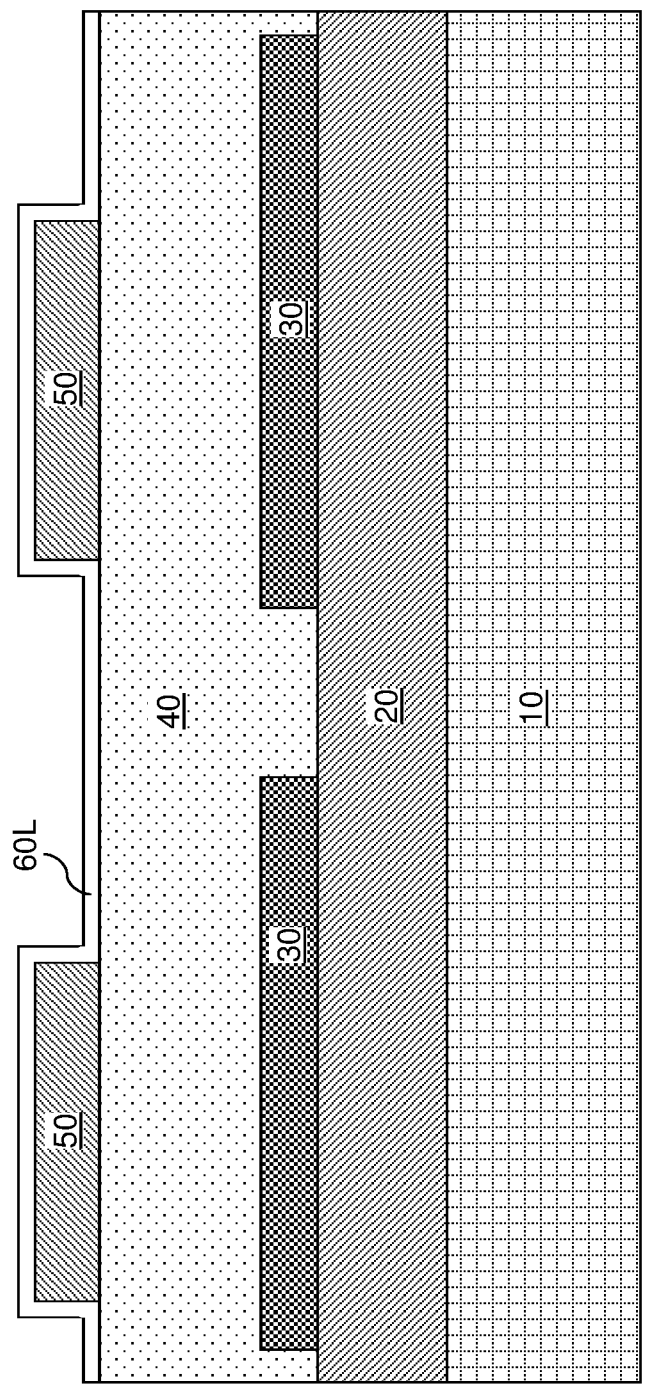
FIG. 3 is a schematic vertical cross-sectional view of the first exemplary structure after formation of IGZO channels and a gate dielectric according to the first embodiment of the present disclosure.

Referring to FIG. 3, the IGZO layer 50L can be patterned into discrete portions, for example, by application and patterning of a photoresist layer over the IGZO layer 50L, and by an etch process that transfers the pattern in the photoresist layer through the IGZO layer 50L. An anisotropic etch or an isotropic etch can be employed to pattern the IGZO layer 50L. Each patterned portion of the IGZO layer 50L constitutes an IGZO channel 50, which is a channel region of an IGZO field effect transistor to be subsequently formed. The photoresist layer can be subsequently removed, for example, by ashing.

A gate dielectric layer 60L is formed on the physically exposed surfaces of the at least one dielectric isolation layer 40 and the IGZO channels 50. The gate dielectric layer 60L may be formed as a continuous material layer. The gate dielectric layer 60L may include a single dielectric material layer or may include a stack of multiple dielectric material layers. The gate dielectric layer 60L includes a gate dielectric material such as silicon oxide, silicon oxynitride, at least one dielectric metal oxide material, or a combination or a stack thereof. The thickness of the gate dielectric layer 60L can be in a range from 1 nm to 12 nm, such as from 2 nm to 6 nm, although lesser and greater thicknesses can also be employed. In one embodiment, the gate dielectric layer 60L may be formed as a conformal dielectric material layer.

Figure 4:
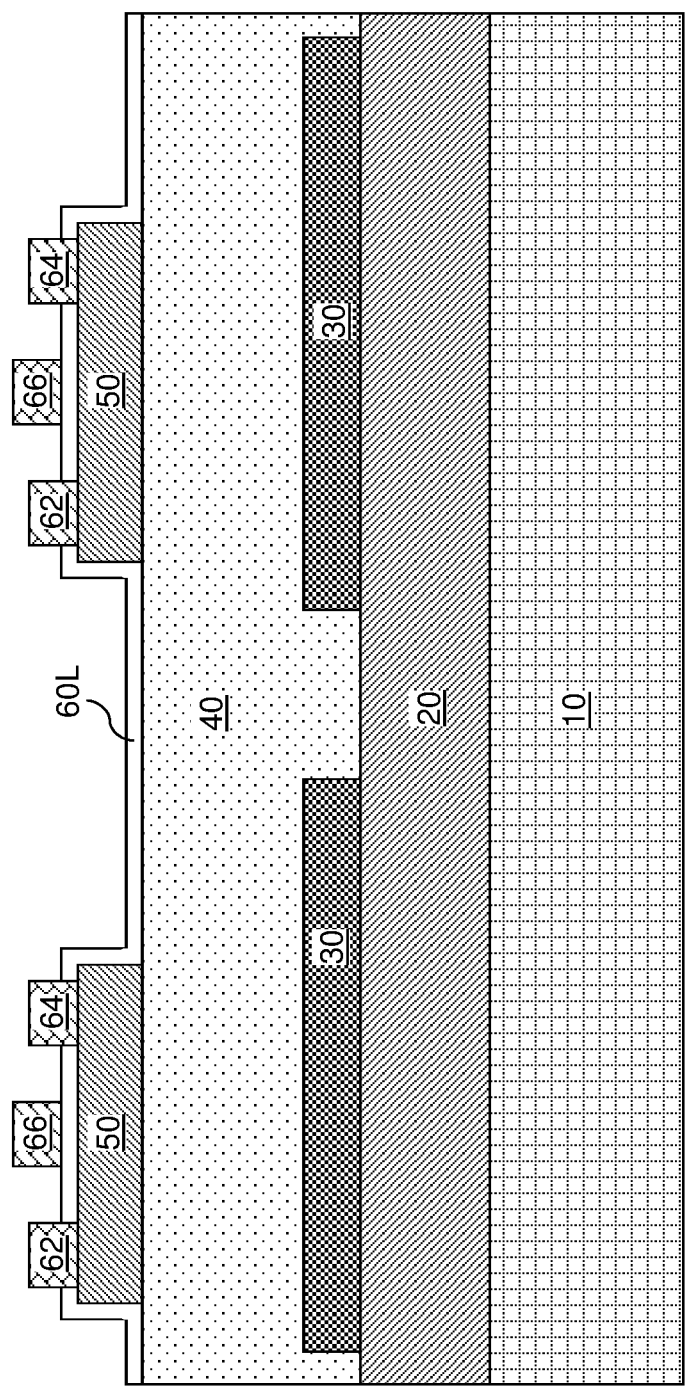
FIG. 4 is a schematic vertical cross-sectional view of the first exemplary structure after formation of gate electrodes, source electrodes, and drain electrodes according to the first embodiment of the present disclosure.

Referring to FIG. 4, a pair of openings is formed through each region of the gate dielectric layer 60L that overlies an IGZO channel 50. The locations of the openings are selected such that an intervening area for forming a gate electrode 66 is provided between each pair of openings on the IGZO channels 50. For example, a photoresist layer (not shown) can be applied over the gate dielectric layer 60L, and can be lithographically patterned by a first lithographic exposure process and a first lithographic development process to form a pair of openings above each IGZO channel 50. An etch process is performed to form openings through the gate dielectric layer 60L underneath each opening in the photoresist layer. Additional patterns of openings can be formed through the photoresist layer by a second lithographic exposure process and a second lithographic development process to form openings within areas in which gate electrodes 66 are to be subsequently formed.

At least one conductive material can be deposited in the openings through the photoresist layer to form a source electrode 62, a drain electrode 64, and a gate electrode 66 on each of the IGZO channels 50. The at least one conductive material can include at least one metallic material (such as TiN, TaN, WN, Ti, Ta, W, or combinations of thereof) and/or at least one heavily doped semiconductor material. Excess portions of the at least one conductive material over the photoresist layer may be removed, for example, by a lift-off process.

Field effect transistors comprising a respective indium gallium zinc oxide (IGZO) channel 50 are formed on the at least one dielectric isolation layer 40. Each IGZO channel 50 can be located above a top surface of the at least one dielectric isolation layer 40. Each field effect transistor comprises a gate dielectric (which is a portion of the gate dielectric layer 60L that contacts the IGZO channel 50) contacting a top surface of the IGZO channel 50. A gate electrode 66 of each field effect transistor overlies the gate dielectric of the field effect transistor.

Figure 5:
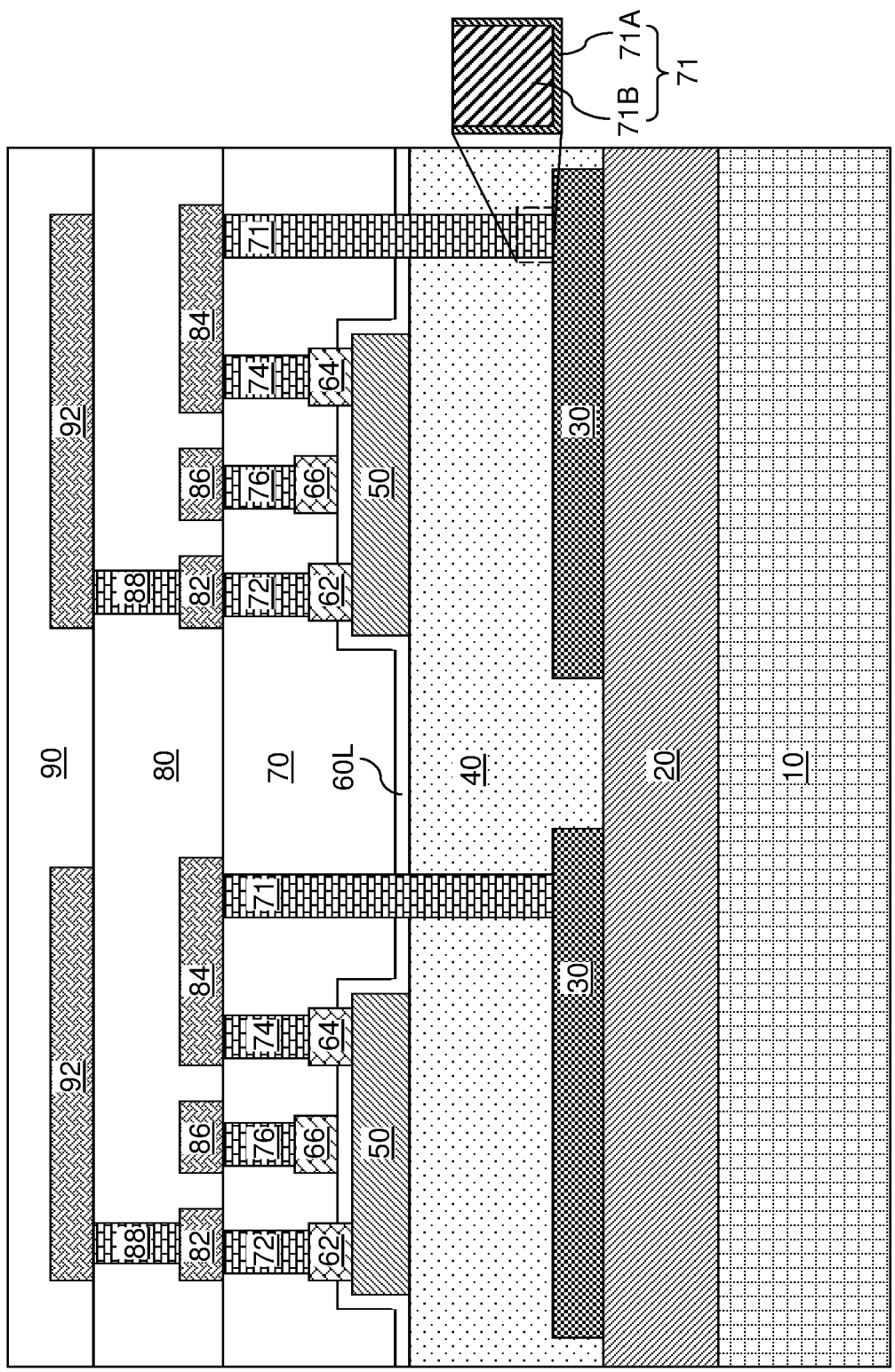
FIG. 5 is a schematic vertical cross-sectional view of the first exemplary structure after formation of metal interconnect structures and interconnect-level dielectric layers according to the first embodiment of the present disclosure.

Referring to FIG. 5, interconnect-level dielectric layer (70, 80, 90) and metal interconnect structures (71, 72, 74, 76, 82, 84, 86, 88, 92) can be formed over the field effect transistors (50, 60, 62, 64, 66). An electrically conductive path (71, 74, 84) that electrically shorts a node of a light emitting diode 20 to a node of a field effect transistor (50, 60, 62, 64, 66) can be formed for each pair of a light emitting diode 20 and a field effect transistor (50, 60, 62, 64, 66) having an areal overlap in a plan view. As used herein, a plan view refers to a view along the vertical direction in which layout of the various light emitting diodes 20 and the field effect transistors (50, 60, 62, 64, 66) are shown.

Each electrically conductive path (71, 74, 84) can include e a contact via structure 71 that extends through the at least one dielectric isolation layer 40, a conductive line structure 84 that contacts a top surface of the contact via structure 71 and located over a field effect transistor (50, 60, 62, 64, 66), and an active region contact via structure 74 that contacts a source electrode 62 or a drain electrode 64 of the field effect transistor (50, 60, 62, 64, 66). In one embodiment, the light emitting diode 20 comprises a top electrode 30 contacting a top surface of the p-doped semiconductor material layer (1250, 1260) and contacting a bottom surface of the contact via structure 71. In one embodiment, the node of the field effect transistor (50, 60, 62, 64, 66) that is electrically shorted to the electrically conductive path (71, 74, 84) comprises a source region 62 or a drain region 64 of the field effect transistor (50, 60, 62, 64, 66).

The interconnect-level dielectric layer (70, 80, 90) can include a contact-level dielectric layer 70 embedding contact via structures (71, 72, 74, 76), a first interconnection-level dielectric layer 80 that overlies the contact-level dielectric layer 70 and embeds first-level conductive line structures (82, 84, 86) and first-level interconnect via structures 88, and a second interconnect-level dielectric layer 90 that overlies the first interconnect-level dielectric layer 80 and embedding second-level conductive line structures 92. The contact via structures (71, 72, 74, 76) can include top electrode contact via structures 71 that contact a respective top electrode 30 of the light emitting diodes 20, source contact via structures 72 that contact a respective source electrode 62 of the field effect transistors (50, 60, 62, 64, 66), drain contact via structures 74 that contact a respective drain electrode 64 of the field effect transistors (50, 60, 62, 64, 66), and gate contact via structures 76 that contact a respective drain electrode 66 of the field effect transistors (50, 60, 62, 64, 66). The first-level conductive line structures (82, 84, 86) can include diode-transistor interconnection lines 84 that contact a respective pair of a top electrode contact via structures 71 and a drain contact via structure 74 or a respective pair of a top electrode contact via structure 71 and a source contact via structure 72. The first-level conductive line structures (82, 84, 86) can further include gate interconnection line structures 86 that contact a respective one of the gate contact via structures 76, and transistor active region interconnect lines 82 that contact a respective one of the source contact via structures 72 and drain contact via structures 74. The first-level interconnect via structures 88 can contact a top surface of a respective one of the transistor active region interconnect lines 82. The second-level conductive line structures 92 can contact a top surface of a respective one of the first-level interconnect via structures 88.

All, or some, of the metal interconnect structures (71, 72, 74, 76, 82, 84, 86, 88. 92) can be formed by forming openings in a respective one of the interconnect-level dielectric layer (70, 80, 90) and by filling the openings with at least one conductive material, which can include, for example, a metallic liner 71A that includes a metallic barrier material such as TiN, TaN, and/or WN and a metallic fill material portion 71B that includes a metallic fill material such as Ti, Ta, W, Cu, Co, Ru, Mo, Al, or combinations thereof. All or some of the first-level conductive line structures (82, 84, 86) and the second-level conductive line structures 92 may be formed by depositing at least one metallic material and by patterning the at least one metallic material.

Figure 6:
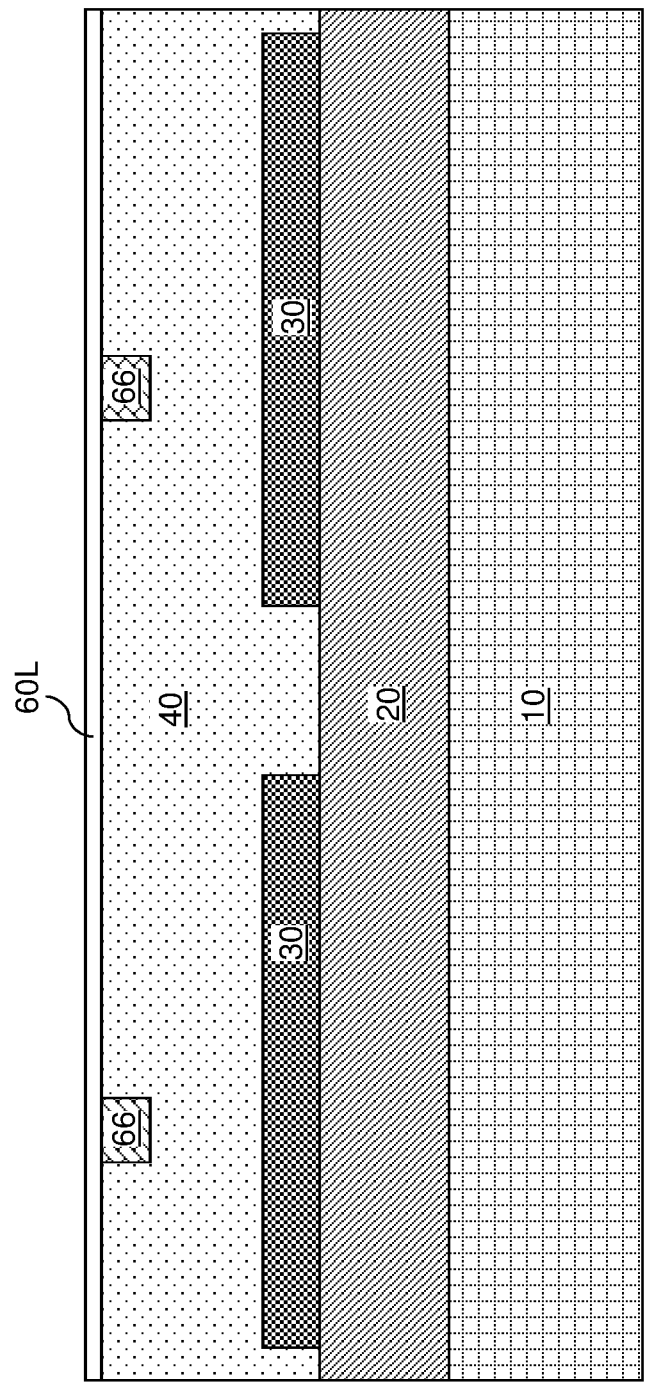
FIG. 6 is a schematic vertical cross-sectional view of an alternative configuration of the first exemplary structure after formation of gate electrodes and a gate dielectric layer according to the first embodiment of the present disclosure.

Referring to FIG. 6, an alternative configuration of the first exemplary structure is illustrated after formation of gate electrodes 66 and a gate dielectric layer 60L. In the alternative configuration, the gate electrodes 66 of the field effect transistors can be formed by forming discrete recessed regions at the top surface of the at least one dielectric isolation layer 40. The discrete recessed regions can be formed, for example, by applying and lithographically patterning a photoresist layer over the at least one dielectric isolation layer 40 to form openings through the photoresist layer, and by transferring the pattern of the openings in the photoresist layer into an upper portion of the at least one dielectric isolation layer 40 employing an anisotropic etch or an isotropic etch. The photoresist layer can be subsequently removed, for example, by ashing. At least one conductive material (which may include a doped semiconductor material and/or a metallic material) can be deposited in the discrete recessed regions, and excess portions of the at least one conductive material can be removed from the top surface of the at least one dielectric isolation layer 40 by a planarization process, such as chemical mechanical planarization or a recess etch. Each remaining portion of the at least one conductive material in the discrete recessed regions constitutes a gate electrode 66. Alternatively, the gate electrodes 66 may be formed by depositing at least one conductive material over the at least one dielectric isolation layer, and by patterning the at least one conductive material into discrete conductive material portions. Each patterned discrete conductive material portion can constitute a gate electrode 66.

A gate dielectric layer 60L can be formed over the gate electrodes 66 and the at least one dielectric spacer layer 40 by deposition of at least one gate dielectric material. In an alternative configuration illustrated in FIG. 6, a gate electrode 66 of each field effect transistor may be embedded within a top portion of, or located over, the at least one dielectric isolation layer 40. A gate dielectric (i.e., a portion of the gate dielectric layer 60L that subsequently contacts a respective IGZO channel to be subsequently formed) of each field effect transistor overlies the gate electrode 66 and the at least one dielectric isolation layer 40.

Figure 7:
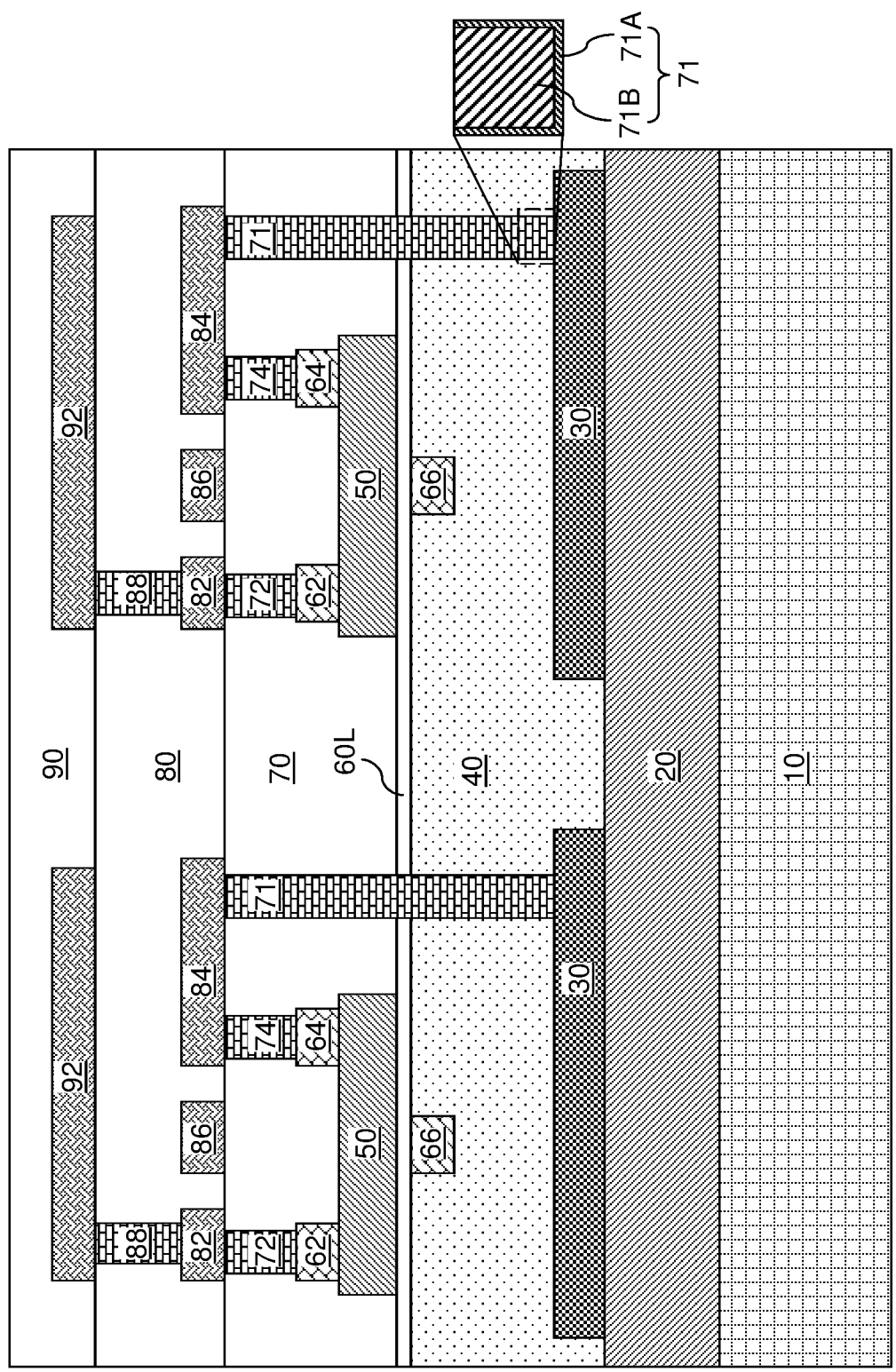
FIG. 7 is a schematic vertical cross-sectional view of the alternative embodiment of the first exemplary structure after formation of metal interconnect structures and interconnect-level dielectric layers according to the first embodiment of the present disclosure.

Referring to FIG. 7, IGZO channels 50 are formed on a top surface of the gate dielectric layer 60L by deposition and patterning of the IGZO material. The IGZO channels 50 can be formed as discrete material portions that do not contact one another. A contact-level dielectric layer 70 is formed over the IGZO channels 50 by deposition of a dielectric material. A pair of openings can be formed through each region of the contact-level dielectric layer 70 that overlies a respective IGZO channel 50. The locations of the openings are selected such that a gate electrode 66 underlies the space between each pair of openings on the IGZO channels 50. For example, a photoresist layer (not shown) can be applied over the gate dielectric layer 60L, and can be lithographically patterned by a lithographic exposure process and a lithographic development process to form a pair of openings above each IGZO channel 50. Two openings laterally offset from an underlying gate electrode 66 is formed per IGZO channel 50.

At least one conductive material can be deposited in the openings through the photoresist layer to form a source electrode 62 and a drain electrode 64 on each of the IGZO channels 50. The at least one conductive material can include at least one metallic material (such as TiN, TaN, WN, Ti, Ta, W, or combinations of thereof) and/or at least one heavily doped semiconductor material. Excess portions of the at least one conductive material over the photoresist layer may be removed, for example, by a lift-off process that removes the photoresist layer.

Field effect transistors comprising a respective indium gallium zinc oxide (IGZO) channel 50 are formed on, and over, the at least one dielectric isolation layer 40. Each IGZO channel 50 can be located above a top surface of the gate dielectric layer 60L, which is located above the at least one dielectric isolation layer 40. Each field effect transistor comprises a gate dielectric (which is a portion of the gate dielectric layer 60L that contacts the IGZO channel 50) contacting a bottom surface of the IGZO channel 50. A gate electrode 66 of each field effect transistor underlies the gate dielectric of the field effect transistor.

Interconnect-level dielectric layer (70, 80, 90) and metal interconnect structures (71, 72, 74, 76, 82, 84, 86, 88. 92) can be formed over the field effect transistors (50, 60, 62, 64, 66). The same processing steps can be employed as the processing steps employed to form the interconnect-level dielectric layer (70, 80, 90) and metal interconnect structures (71, 72, 74, 76, 82, 84, 86, 88. 92) of FIG. 5. An electrically conductive path (71, 74, 84) that electrically shorts a node of a light emitting diode 20 to a node of a field effect transistor (50, 60, 62, 64, 66) can be formed for each pair of a light emitting diode 20 and a field effect transistor (50, 60, 62, 64, 66) having an areal overlap in a plan view. Locations of gate contact via structures 76 (not shown in FIG. 7) can be selected to avoid contact with the IGZO channels 50 and to provide electrical contact with the gate electrodes 66.

Figure 8:
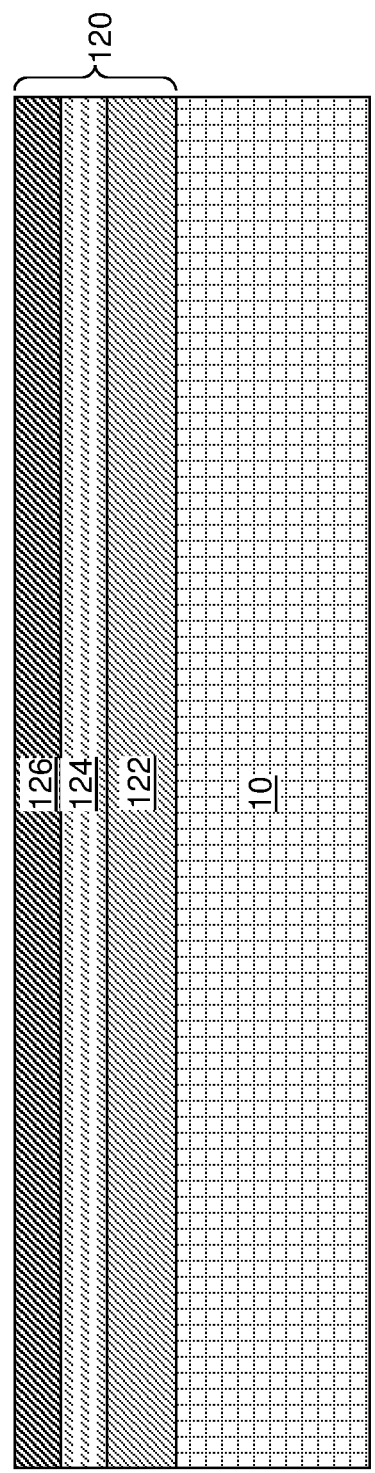
FIG. 8 is a schematic vertical cross-sectional view of a second exemplary structure after formation of a high-electron-mobility transistor (HEMT) body layer stack according to a second embodiment of the present disclosure.

Referring to FIG. 8, a second exemplary structure according to a second embodiment of the present disclosure is illustrated after formation of a high-electron-mobility transistor (HEMT) body layer stack 120 on a substrate 10, which may be an epitaxial substrate. The HEMT body layer stack 120 may be any heterogeneous semiconductor material stack known in the art that can provide a two-dimensional electron gas layer that can be employed to form a HEMT device. In one embodiment, each material layer within the HEMT body layer stack 120 can include an epitaxial semiconductor material layer in epitaxial alignment with the single crystalline material within the substrate 10.

In an illustrative example, the HEMT body layer stack 120 can include, from bottom to top, an epitaxial buffer semiconductor layer 122, an epitaxial semiconductor channel layer 124, and a Schottky barrier semiconductor layer 126. The substrate 10 can include single crystalline aluminum oxide, single crystalline silicon carbide, or single crystalline InP. The epitaxial buffer semiconductor layer 122 can be single crystalline GaN or single crystalline InAlAs, and can be epitaxially aligned to the single crystalline structure of the substrate 10. The thickness of the epitaxial buffer semiconductor layer 122 can be in a range from 0.5 micron to 5 microns, although lesser and greater thicknesses can also be employed. The epitaxial semiconductor channel layer 124 can include GaN or InGaAs. The thickness of the epitaxial semiconductor channel layer 124 can be in a range from 0.5 micron to 5 microns, although lesser and greater thicknesses can also be employed. The Schottky barrier semiconductor layer 126 can include an AlGaN single crystalline material or an InAlAs single crystalline material. The thickness of the Schottky barrier semiconductor layer 126 can be in a range from 10 nm to 60 nm, although lesser and greater thicknesses can also be employed. Optionally, the Schottky barrier semiconductor layer 126 can include silicon in a δ-doping layer, i.e., as a thin layer having a high concentration of silicon. In some embodiments, the Schottky barrier semiconductor layer 126 can include a stack including, from bottom to top, an undoped AlGaAs spacer and an n-doped AlGaAs layer. Each of the layers within the HEMT body layer stack 120 can be epitaxially aligned to the epitaxial material within the substrate 10. Generally, any semiconductor material layer stack known to provide a high mobility electron gas layer can be employed to form the HEMT body layer stack 120.

Figure 9:
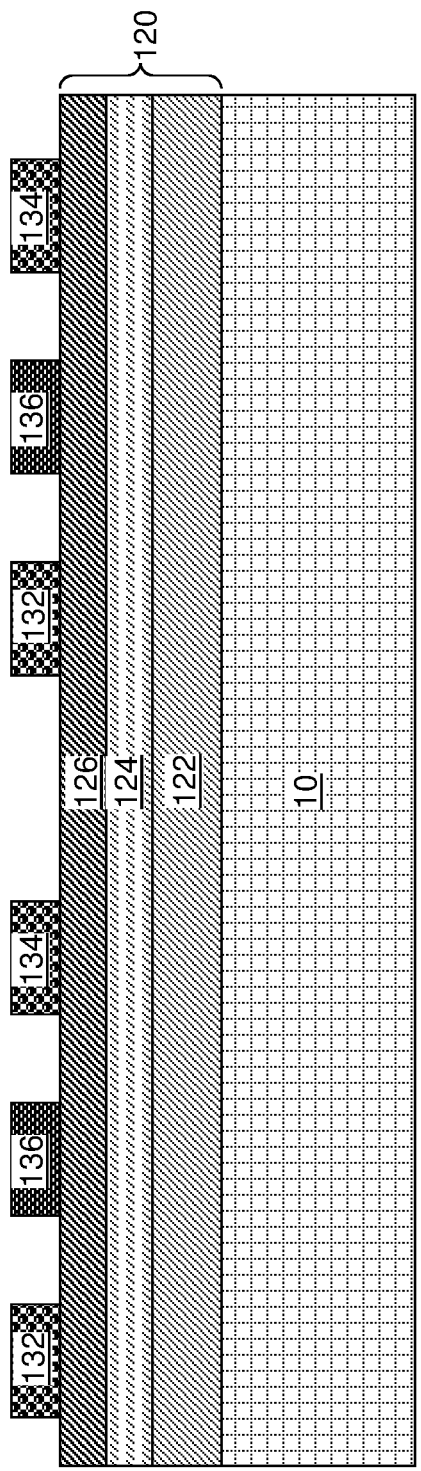
FIG. 9 is a schematic vertical cross-sectional view of the second exemplary structure after formation of gate electrodes, source electrodes, and drain electrodes for HEMT devices according to the second embodiment of the present disclosure.

Referring to FIG. 9, gate electrodes 136, source electrodes 132, and drain electrodes 134 are formed for the HEMT devices. The gate electrodes 136 can be formed, for example, by applying and patterning a photoresist layer over the HEMT body layer stack 120 to form a pattern of openings having the shapes of gate electrodes 136 to be formed. A metal stack that provides a Schottky barrier is deposited in the openings in the photoresist layer. For example, the metal stack can include a stack of a platinum layer, a titanium layer, a platinum layer, and a gold layer or a stack of a titanium layer, an aluminum layer, and a titanium layer. The photoresist layer and portions of the metal stack that overlie the photoresist layer can be lifted off. The remaining portion of the metal stack constitute the gate electrodes 136.

Another photoresist layer can be applied and patterned over the HEMT body layer stack 120 to form a pattern of openings having the shapes of source electrodes 132 and drain electrodes 134 to be formed. A metal stack that provides an Ohmic contact can be deposited in the openings through the photoresist layer on the HEMT body layer stack 120. For example, the metal stack can include a stack of a titanium layer, an aluminum layer, a titanium layer, and a gold layer, or a stack of a titanium layer, an aluminum layer, a molybdenum layer, and a gold layer. The photoresist layer and portions of the metal stack that overlie the photoresist layer can be lifted off. Remaining portions of the metal stack constitute the source electrodes 132 and the drain electrodes 134. High-electron-mobility transistor (HEMT) devices comprising an epitaxial semiconductor channel layer 124 are formed over the substrate 10, which can be an epitaxial substrate.

Figure 10:
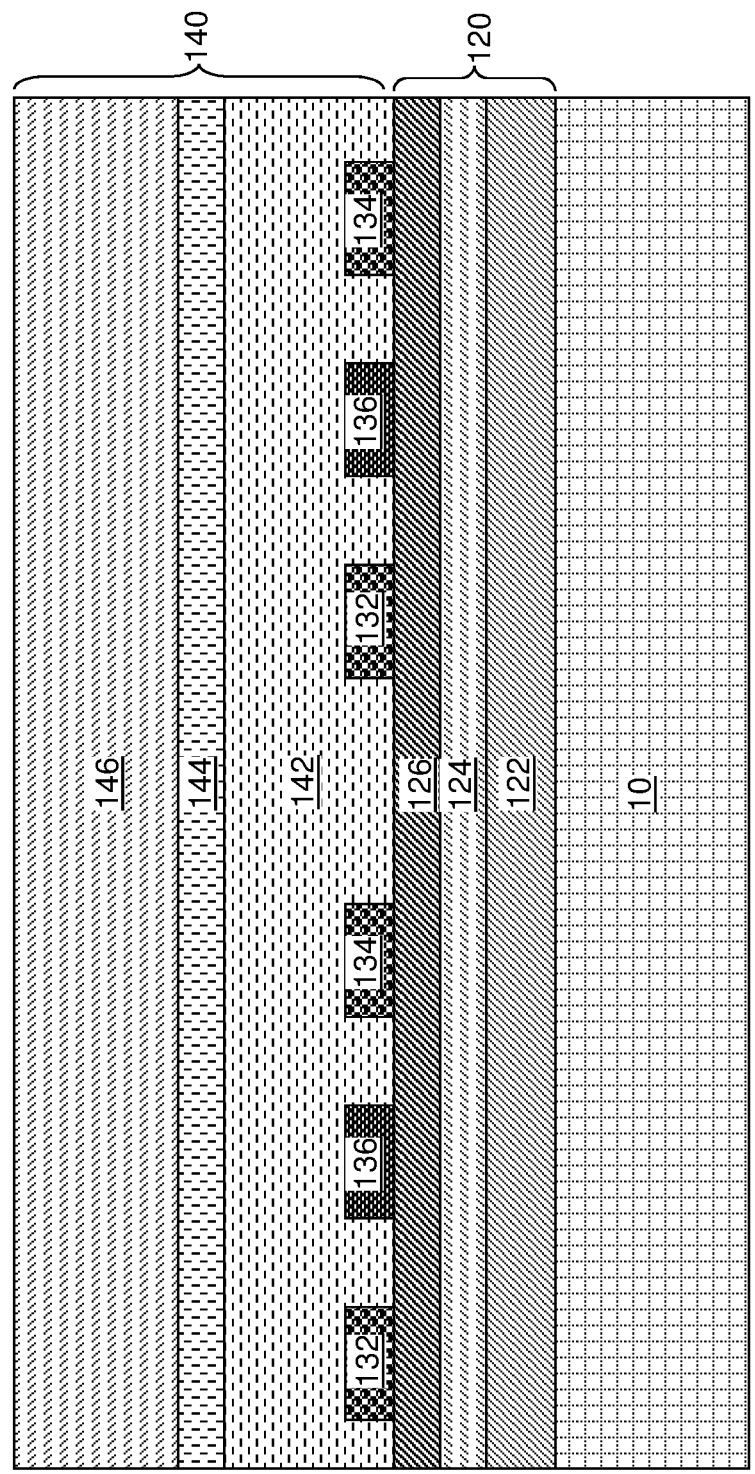
FIG. 10 is a schematic vertical cross-sectional view of the second exemplary structure after formation of an isolation layer stack according to the second embodiment of the present disclosure.
Figure 11:
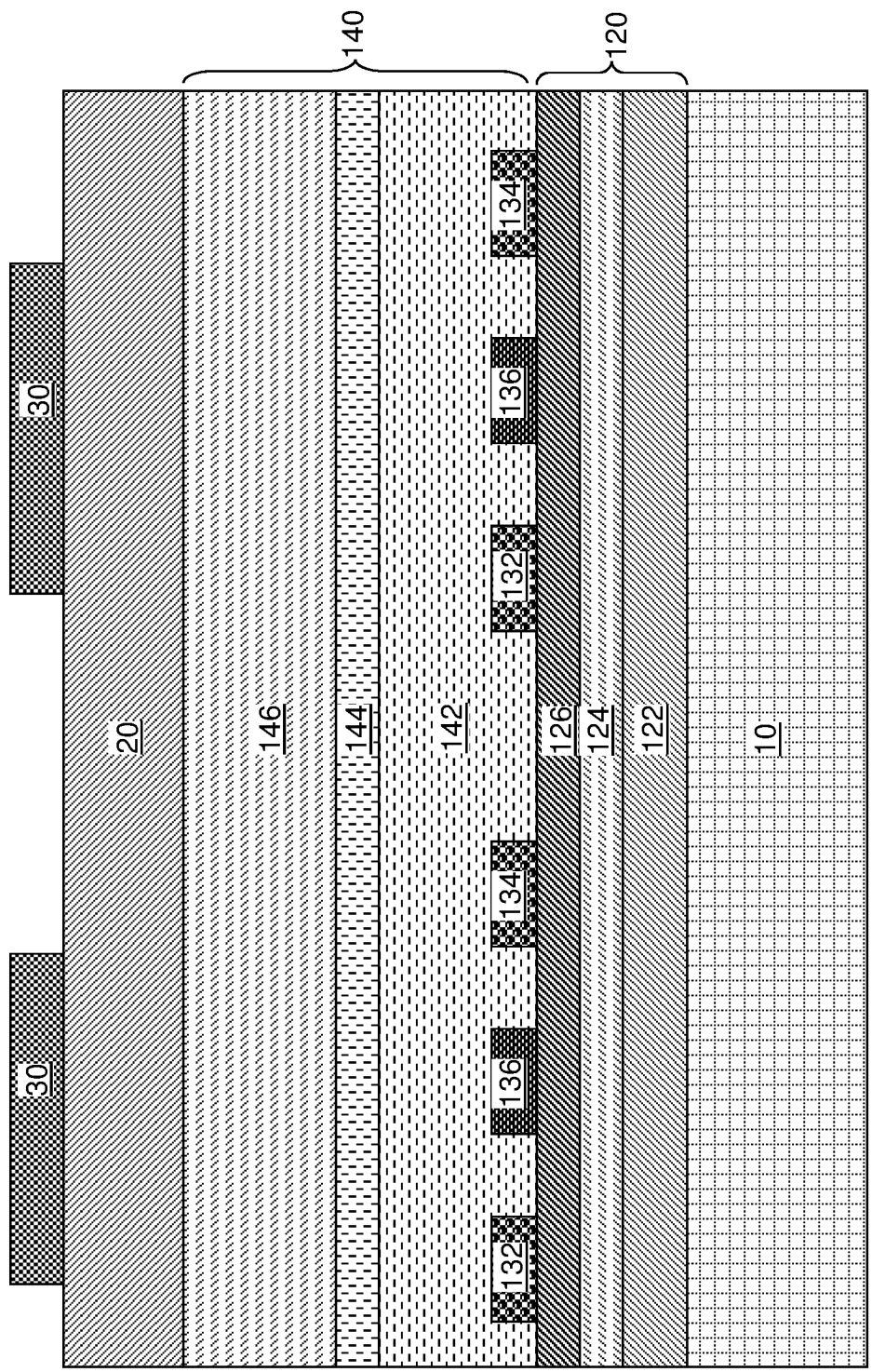
FIG. 11 is a schematic vertical cross-sectional view of the second exemplary structure after formation of light emitting diodes according to the second embodiment of the present disclosure.

Referring to FIG. 10, at least one isolation layer 140 is formed over the HEMT devices. The at least one isolation layer 140 provides electrical isolation between the HEMT devices and devices to be subsequently formed over the at least one isolation layer 140. In one embodiment, the at least one isolation layer 140 can include, from bottom to top, a lower crystalline graded composition layer 142, a crystalline electrically insulating layer 144, and an upper crystalline graded composition layer 146.

The lower crystalline graded composition layer 142 can have a vertical compositional gradient such that the lattice constant at the bottom of the lower crystalline graded composition layer 142 substantially matches the lattice constant of the Schottky barrier semiconductor layer 126 and the lattice constant at the top of the lower crystalline graded composition layer 142 substantially matches the lattice constant of the crystalline electrically insulating layer 144. For example, the lower crystalline graded composition layer 142 can be a graded AlGaN layer in which the atomic concentration of aluminum increases with the distance from the substrate 10. The thickness of the lower crystalline graded composition layer 142 can be in a range from 0.2 micron to 4 microns, although lesser and greater thicknesses can also be employed. The lower crystalline graded composition layer 142 can be formed by a selective or non-selective epitaxial deposition process. In one embodiment, a selective epitaxial deposition process can be employed to form the lower crystalline graded composition layer 142, and the lower crystalline graded composition layer 142 can grow over the gate electrodes 136, the source electrodes 132, and the drain electrodes 134 of the HEMT devices. The overgrown portions of the lower crystalline graded composition layer 142 can merge above the gate electrodes 136, the source electrodes 132, and the drain electrodes 134 such that the top portion of the lower crystalline graded composition layer 142 can be single crystalline with dislocations over the areas of the gate electrodes 136, the source electrodes 132, and the drain electrodes 134, or may include large grains having a same set of crystallographic orientations and grain boundaries therebetween.

The ratio of the total physically exposed area of the HEMT body layer stack 126 to the total area covered by the gate electrodes 136, the source electrodes 132, and the drain electrodes 134 can be maintained in a range that allows epitaxial alignment of a predominant portion (such as more than 50% in volume) of the at least one isolation layer 140 to the epitaxial material layers within the HEMT body layer stack 120. For example, the ratio of the total physically exposed area of the HEMT body layer stack 126 to the total area covered by the gate electrodes 136, the source electrodes 132, and the drain electrodes 134 can be in a range from 1:2 to 10:1 such as from 1:1 to 3:1, although lesser and greater ratios can also be employed. Optionally, thin dielectric liners (not shown) may be formed to cover the gate electrodes 136, the source electrodes 132, and the drain electrodes 134, and to suppress epitaxial growth of the material(s) of the at least one isolation layer 140, while enabling growth of the epitaxial material(s) of the at least one isolation layer 140 from the physically exposed surfaces of the HEMT body layer stack 120.

The crystalline electrically insulating layer 144 includes an electrically insulating crystalline material such as AlN. The thickness of the crystalline electrically insulating layer 144 can be in a range from 1 nm to 100 nm, although lesser and greater thicknesses can also be employed. The crystalline electrically insulating layer 144 can be substantially single crystalline, or may have large grain sizes with a same set of crystallographic orientations and grain boundaries therebetween.

The upper crystalline graded composition layer 146 can have a vertical compositional gradient such that the lattice constant at the bottom of the upper crystalline graded composition layer 146 substantially matches the lattice constant of the crystalline electrically insulating layer 144 and the lattice constant at the top of the upper crystalline graded composition layer 146 substantially matches the lattice constant of a single crystalline semiconductor material layer to be subsequently formed thereabove. For example, the single crystalline semiconductor material layer to be subsequently formed can include a first single crystalline n-doped gallium nitride layer 804 described above. In one embodiment, the upper crystalline graded composition layer 146 can be a graded AlGaN layer in which the atomic concentration of aluminum decreases with the distance from the substrate 10. The thickness of the upper crystalline graded composition layer 146 can be in a range from 0.2 micron to 4 microns, although lesser and greater thicknesses can also be employed.

In one embodiment, the aluminum concentration in the upper region of the lower crystalline graded composition layer 142 and/or the lower region of the upper crystalline graded composition layer 146 can be high enough that the upper region of the lower crystalline graded composition layer 142 and/or the lower region of the upper crystalline graded composition layer 146 constitute electrically insulating layers. In this case, the crystalline electrically insulating layer 144 may be omitted, and the upper region of the lower crystalline graded composition layer 142 and/or the lower region of the upper crystalline graded composition layer 146 can provide electrical isolation along a vertical direction. Generally, the at least one isolation layer 140 includes at least one electrically insulating layer in the form of a crystalline electrically insulating layer 144, an upper region of the lower crystalline graded composition layer 142, and/or a lower region of the upper crystalline graded composition layer 146. The at least one isolation layer 140, including the at least one electrically insulating layer, includes at least one epitaxial dielectric material in epitaxial alignment with the epitaxial semiconductor channel layer 124.

In one embodiment, the lower crystalline graded composition layer 142 can be embodied as a first graded aluminum gallium nitride layer in which an atomic concentration of aluminum increases with a vertical distance from the epitaxial substrate, the crystalline electrically insulating layer 144 can be embodied as an aluminum nitride layer located on the first graded aluminum gallium nitride layer and including aluminum nitride as the epitaxial dielectric material, and the upper crystalline graded composition layer 146 can be embodied as a second graded aluminum gallium nitride layer in which an atomic concentration of aluminum decreases with a vertical distance from the epitaxial substrate.

Referring to FIGS. 11 and 1B-1E, light emitting diodes 20 and top electrodes 30 can be formed in the same manner as in the first embodiment. Any of the configurations described above can be employed to form the light emitting diodes 20 and the top electrodes 30. Generally, a light emitting diode 20 comprises an n-doped semiconductor material layer (such as a first single crystalline n-doped gallium nitride layer 804), a light-emitting active region, 1130 and a p-doped semiconductor material layer (1250, 1260). The light-emitting active region 30 comprises an epitaxial semiconductor material in epitaxial alignment with the at least one isolation layer 140 and with the HEMT body layer stack 120 and with the epitaxial material in the substrate 10.

Figure 12A:
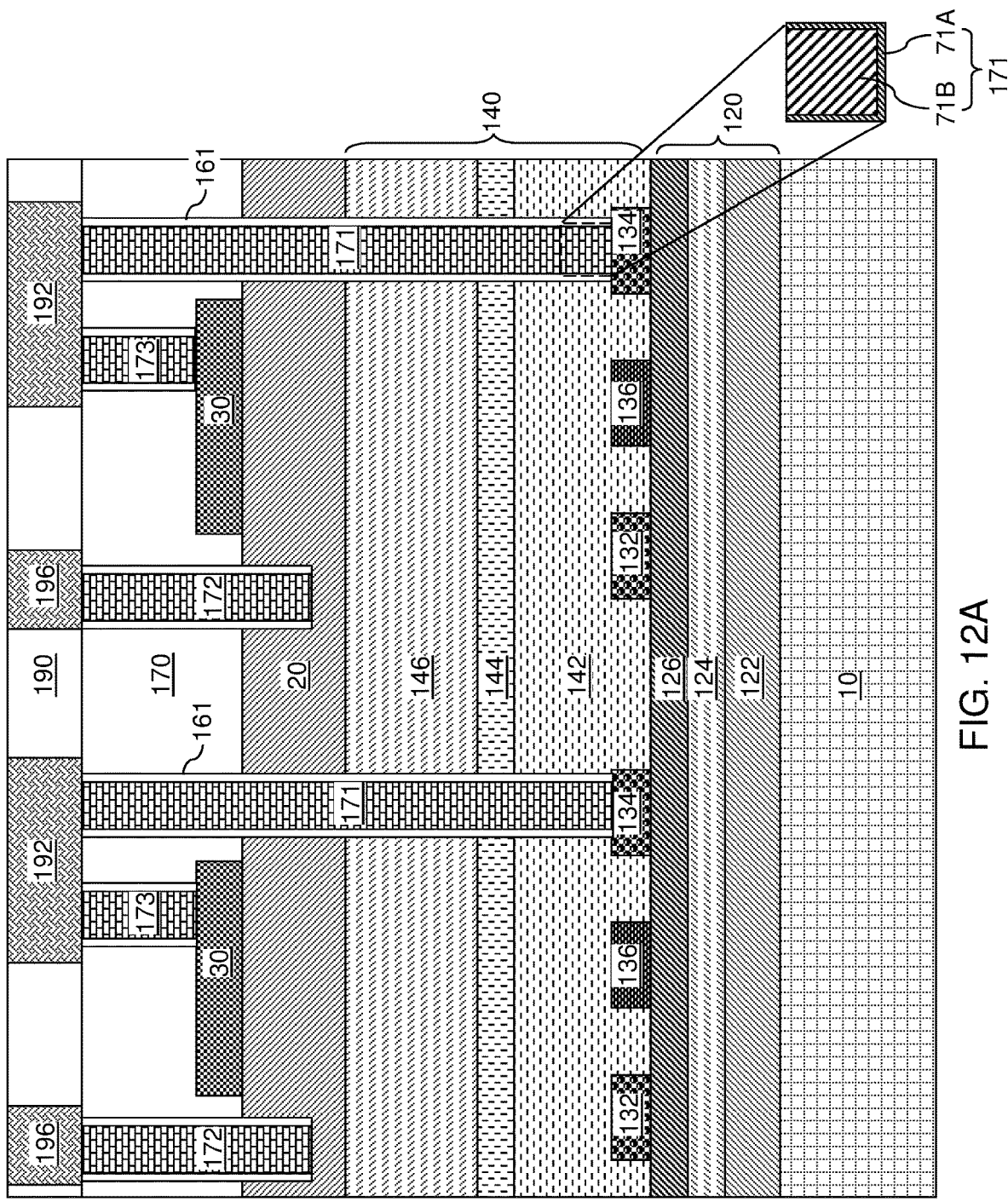
FIG. 12A is a schematic vertical cross-sectional view of the second exemplary structure after formation of metal interconnect structures and interconnect-level dielectric layers according to the second embodiment of the present disclosure.
Figure 12B:
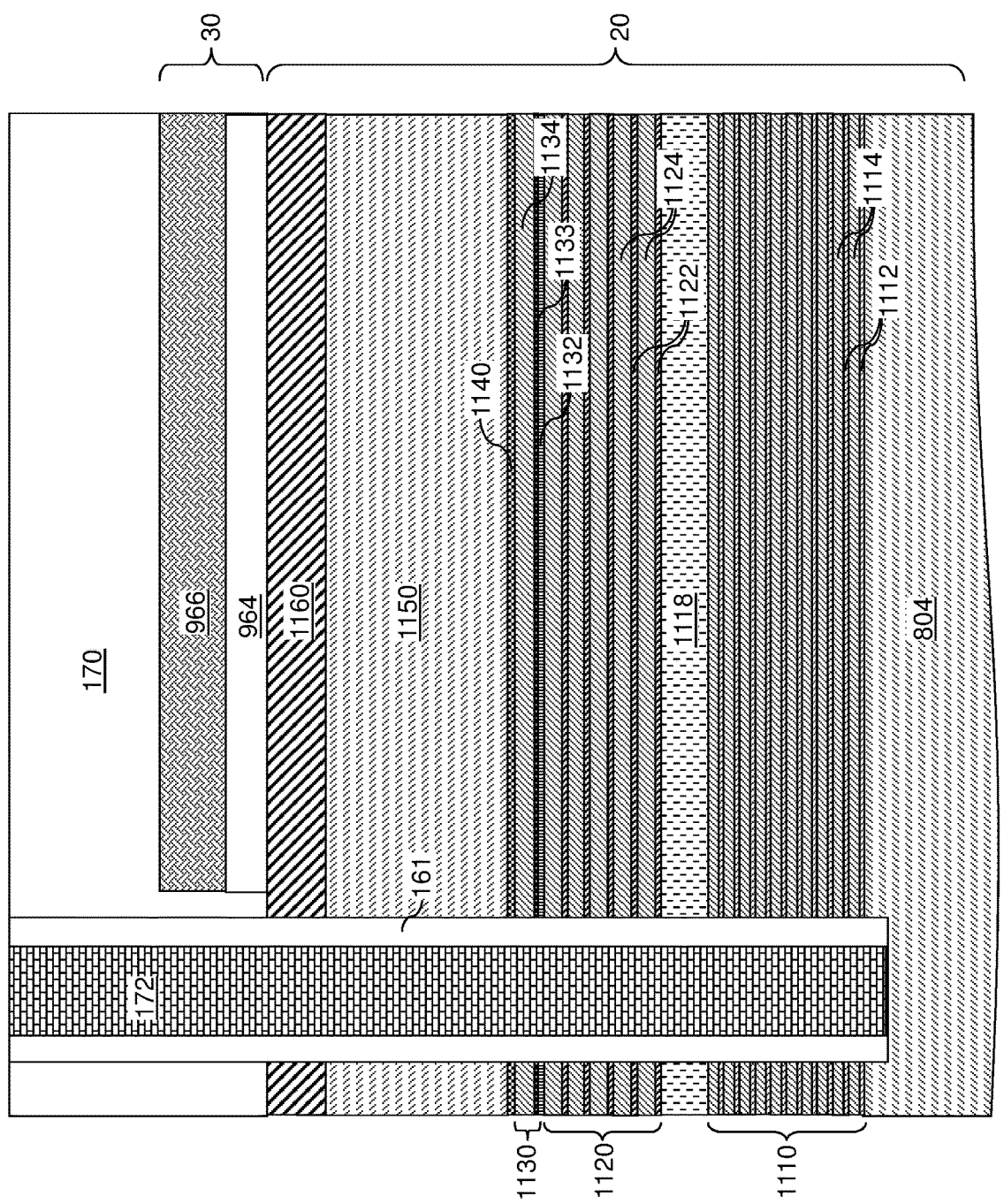
FIG. 12B is a magnified vertical cross-sectional view of the light emitting device of the second exemplary structure of FIG. 12A.

Referring to FIGS. 12A and 12B, interconnect-level dielectric layers (170, 190) and metal interconnect structures (171, 182, 173, 192, 196) can be formed over the light emitting diodes 20 and the top electrodes 30. The light emitting diodes 20 can overlie, and can have an areal overlap in a plan view with, a respective HEMT (120, 132, 134, 136). In one embodiment, an electrically conductive path (171, 192, 173) that electrically shorts a node of the light emitting diode 20 to a node of the HEMT (120, 132, 134, 136) for each vertically neighboring pair of a light emitting diode 20 and an HEMT (120, 132, 134, 136). In one embodiment, the electrically conductive path (171, 192, 173) comprises a contact via structure (which is herein referred to as HEMT contact via structure 171) that extends through the at least one isolation layer 140, a conductive line structure (which is herein referred to as a diode-transistor interconnection line 192) that contacts a top surface of the HEMT contact via structure 171 and located above a top surface of the at least one isolation layer 140, and a first diode contact via structure 173 that contacts a bottom electrode (such as a first single crystalline n-doped gallium nitride layer 804) or a top electrode 30 of the light emitting diode 20. In an embodiment, a bottom surface of the HEMT contact via structure 171 can contact a drain electrode 134 of the HEMT (120, 132, 134, 136) as shown in FIG. 12B. In another embodiment, a bottom surface of the HEMT contact via structure 171 can contact a source electrode 132 of the HEMT (120, 132, 134, 136) (not shown). Dielectric liners 161 can be provided to provide lateral electrical isolation to all, or some, of the contact via structures (171, 172, 173).

The interconnect-level dielectric layer (170, 190) can include a contact-level dielectric layer 170 embedding contact via structures (171, 172, 173) and an interconnection-level dielectric layer 190 that overlies the contact-level dielectric layer 170 and embeds conductive line structures (192, 196). The contact via structures (171, 172, 173) can include the HEMT contact via structures 171 that contact a node of a respective HEMT (120, 132, 134, 136), top contact via structures 173 that contact a respective top electrode 30 of the light emitting diodes 20, and bottom contact via structures 172 that contact a respective bottom electrode (such as a first single crystalline n-doped gallium nitride layer 804) of the light emitting diodes 20. The conductive line structures (192, 196) can include diode-transistor interconnection lines 192 that contact a respective pair of an HEMT contact via structures 171 contacting an HEMT and one of a top electrode contact via structure 173 and a bottom electrode contact via structure 172 that are connected to an overlying light emitting diode 20. The conductive line structures (192, 196) include diode interconnection line structures 196. Each diode interconnection line structure 196 can contact another of the top electrode contact via structure 173 and the bottom electrode contact via structure 172 connected to a light emitting diode 20 that overlies an HEMT.

All or some of the metal interconnect structures (171, 172, 173, 192, 196) can be formed by forming openings in a respective one of the interconnect-level dielectric layer (170, 190) and by filling the openings with at least one conductive material, which can include, for example, a metallic liner 71A that includes a metallic barrier material such as TiN, TaN, and/or WN and a metallic fill material portion 71B that includes a metallic fill material such as Ti, Ta, W, Cu, Co, Ru, Mo, Al, or combinations thereof. In this case, a dielectric liner 161 can laterally surround each conductive via structure (171, 172, 173) and can vertically extend through each of the at least one isolation layer 140. All or some of the conductive line structures (192, 196) may be formed by depositing at least one metallic material and by patterning the at least one metallic material.

Referring to all embodiments of the present disclosure, each of the material layers within the light emitting diodes 20 can be single crystalline epitaxial material layers with the exception of the growth mask 42 in the third configuration illustrated in FIGS. 1D and 1E. As such, the active regions 1130 or the light emitting region shells 1230 of the light emitting diodes 20 can be single crystalline, and can provide effective emission of light. By providing control transistors above or below light emitting diodes 20, the need to transfer any light emitting diode 20 to a backplane is eliminated. Light emitting diodes 20 emitting light at different peak wavelengths can be formed on the same substrate 10 by masking various areas of the device area with temporary or permanent masking material layers and/or by altering material compositions of the active regions 1130 or the light emitting region shells 1230 across the various device areas, thereby forming an array of pixels including multiple sub-pixels emitting light at different peak wavelengths (such as at a red color, at a green color, and at a blue color). A direct view display device including built-in control transistors can be formed without transferring any light emitting diode. The control transistors may be IGZO transistors including a respective IGZO channel, or may be a HEMT transistor including a respective region of a two-dimensional electron gas layer.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:

1. A light emitting device, comprising:
an epitaxial substrate;
a high-electron-mobility transistor (HEMT) located on the epitaxial substrate and comprising an epitaxial semiconductor channel layer;
at least one isolation layer located over the HEMT;
a light emitting diode comprising an n-doped semiconductor material layer, a light-emitting active region, and a p-doped semiconductor material layer, wherein the light-emitting active region comprises an epitaxial semiconductor material in epitaxial alignment with the at least one isolation layer; and
an electrically conductive path that electrically shorts a node of the light emitting diode to a node of the HEMT,
wherein the HEMT and the light emitting diode have an areal overlap in a plan view,
wherein the at least one isolation layer comprises an epitaxial dielectric material in epitaxial alignment with the epitaxial semiconductor channel layer, and
wherein the at least one isolation layer comprises a layer stack including, from bottom to top:
a first graded aluminum gallium nitride layer in which an atomic concentration of aluminum increases with a vertical distance from the epitaxial substrate;
an aluminum nitride layer located on the first graded aluminum gallium nitride layer and including aluminum nitride as the epitaxial dielectric material; and
a second graded aluminum gallium nitride layer in which an atomic concentration of aluminum decreases with a vertical distance from the epitaxial substrate.

2. The light emitting device of claim 1, wherein the electrically conductive path comprises a contact via structure that extends through the at least one isolation layer.

3. The light emitting device of claim 2, wherein the electrically conductive path further comprises a conductive line structure that is located above a top surface of the at least one isolation layer and contacts a top surface of the contact via structure.

4. The light emitting device of claim 2, wherein a bottom surface of the contact via structure contacts a source electrode of the HEMT or a drain electrode of the HEMT.

5. The light emitting device of claim 2, further comprising a dielectric liner laterally surrounding the conductive via structure and extending through each of the at least one isolation layer.

6. A light emitting device, comprising:
an epitaxial substrate;
a high-electron-mobility transistor (HEMT) located on the epitaxial substrate and comprising an epitaxial semiconductor channel layer;
at least one isolation layer located over the HEMT;
a light emitting diode comprising an n-doped semiconductor material layer, a light-emitting active region, and a p-doped semiconductor material layer, wherein the light-emitting active region comprises an epitaxial semiconductor material in epitaxial alignment with the at least one isolation layer; and
an electrically conductive path that electrically shorts a node of the light emitting diode to a node of the HEMT,
wherein the at least one isolation layer comprises an epitaxial dielectric material in epitaxial alignment with the epitaxial semiconductor channel layer; and
wherein the at least one isolation layer comprises a layer stack including, from bottom to top:
a first graded aluminum gallium nitride layer in which an atomic concentration of aluminum increases with a vertical distance from the epitaxial substrate;
an aluminum nitride layer located on the first graded aluminum gallium nitride layer and including aluminum nitride as the epitaxial dielectric material; and
a second graded aluminum gallium nitride layer in which an atomic concentration of aluminum decreases with a vertical distance from the epitaxial substrate.

* * * * *